(12) United States Patent
Ohkawa

(10) Patent No.: US 6,894,268 B2
(45) Date of Patent: May 17, 2005

(54) SEMICONDUCTOR PHOTODETECTOR OF HIGH SENSITIVITY AND SMALL LEAK CURRENT

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 4 days.

(21) Appl. No.: 10/631,757

(22) Filed: Aug. 1, 2003

(65) Prior Publication Data

US 2004/0021060 A1 Feb. 5, 2004

(30) Foreign Application Priority Data

Aug. 1, 2002 (JP) .................................. 2002-224850

(51) Int. Cl.[7] .............................................. H01L 31/00
(52) U.S. Cl. ........................ 250/214.1; 250/208.1; 257/292
(58) Field of Search .................... 250/214.1, 208.1; 257/290, 291, 292, 462, 463, 464; 438/57, 60

(56) References Cited

U.S. PATENT DOCUMENTS

| | | | |
|---|---|---|---|
| 6,621,064 B2 * | 9/2003 | Chen et al. | 250/214.1 |
| 6,730,899 B1 * | 5/2004 | Stevens et al. | 250/208.1 |
| 6,756,616 B2 * | 6/2004 | Rhodes | 257/291 |

FOREIGN PATENT DOCUMENTS

| | | |
|---|---|---|
| JP | 11-274455 | 10/1999 |
| JP | 11-274458 | 10/1999 |
| JP | 2000-286405 | 10/2000 |
| JP | 2001-144318 | 5/2001 |
| JP | 2002-16243 | 1/2002 |

* cited by examiner

*Primary Examiner*—David Porta
*Assistant Examiner*—Seung C. Sohn
(74) *Attorney, Agent, or Firm*—Westerman, Hattori, Daniels & Adrian, LLP

(57) ABSTRACT

A first layer of a first conductivity type is formed in a partial surface layer of an active region of a semiconductor substrate. A buried layer of a second conductivity type is disposed being partially superposed upon the first layer as viewed in plan. The buried layer is deeper than the first layer, and the upper surface of the buried layer is set to a position deeper than the bottom of a device isolation insulating region. A MISFET is formed in a region of the active region where the first layer is not formed. The bottoms of first and second impurity concentration regions corresponding to the source and drain of MISFET are disposed at a position shallower than the upper surface of the buried layer. A buried layer connection region of the second conductivity type electrically interconnects the first impurity diffusion region and the buried layer.

15 Claims, 16 Drawing Sheets

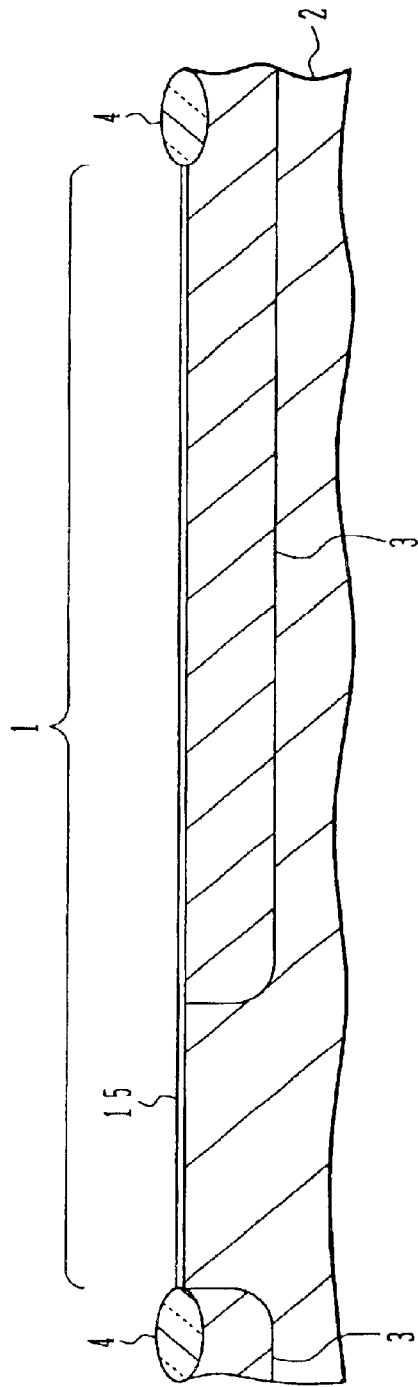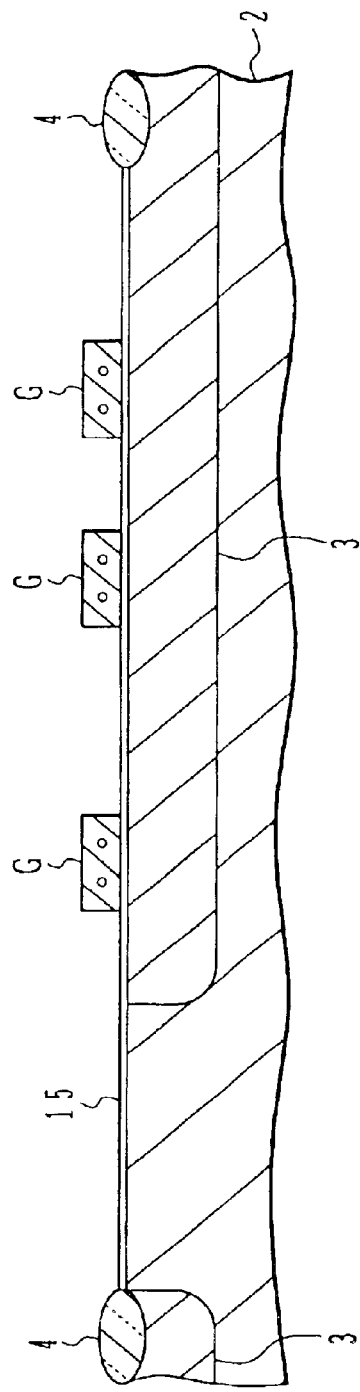

SEMICONDUCTOR PHOTODETECTOR OF HIGH SENSITIVITY AND SMALL LEAK CURRENT

CROSS REFERENCE TO RELATED APPLICATION

This application is based on Japanese Patent Application No. 2002-224850, filed on Aug. 1, 2002, the entire contents of which are incorporated herein by reference.

BACKGROUND OF THE INVENTION

A) Field of the Invention

The present invention relates to a semiconductor photo detector, and more particularly to a semiconductor photo detector of the type that a MISFET (metal/insulator/semiconductor type field effect transistor) is connected to one terminal of a photodiode and the photodiode can be initialized by making MISFET conductive.

B) Description of the Related Art

CMOS type solid-state imaging devices have been proposed after the advent of CCD type solid-state imaging devices. Characteristic features of a CMOS type solid-state imaging device are a single power source, a low voltage drive and a low consumption power. Generally, CMOS type solid-state imaging devices are classified into the three-transistor type that one pixel is constituted of three transistors and one photodiode and the four-transistor type that one pixel is constituted of four transistors and one photodiode.

In a three-transistor type solid-state imaging device, one pixel includes a reset transistor, a source follower transistor and a select transistor. The reset transistor initializes the photodiode to a reset voltage. The source follower has the gate electrode connected to the photodiode and is controlled by voltage generated across the photodiode. The select transistor is serially connected to the source follower transistor to perform switching for reading a pixel signal. In a four-transistor type solid-state imaging device, a transfer transistor is inserted between a photodiode and the gate electrode of a source follower transistor, respectively of each pixel of a three-transistor type solid-state imaging device.

In the solid-state imaging device of either one of the three- and four-transistor types, when an image is to be taken, the reset transistor is first made conductive to initialize the n-type layer of the photodiode to a reference voltage (reset voltage). Thereafter, the photodiode receives light during a predetermined period. With this light reception, electrons are accumulated in the n-type layer of the photodiode and the n-type layer lowers its voltage. This voltage change is detected with the source follower transistor and output via the select transistor.

The voltage change of the n-type layer of the photodiode is dependent upon a junction capacitance of the photodiode. The smaller the junction capacitance, the larger the voltage changes. By reducing the junction capacitance of the photodiode, a photo detector sensitivity can be improved.

FIG. 14A is a cross sectional view of a photodiode and a reset transistor of a conventional CMOS type solid-state imaging device using an $n^+p$-type photodiode. A field oxide film 201 is formed on the surface of a p-type silicon substrate 200, and defines active regions. The field oxide film 201 is disposed in a p-type well 205. An n-type layer 202 is formed in a partial surface layer of the active region. A partial outer periphery of the n-type layer 202 is in contact with the field oxide film 201. A p-type well 203 is formed in the active region where the n-type layer 202 is not formed. In this p-type well 203, an n-channel reset transistor 204 is formed.

The reset transistor 204 comprises: a source region 204S and a drain region 204D sandwiching a channel region; and a gate electrode 204G formed on a gate insulating film on the channel region. The source region 204S is in contact with the n-type layer 202. A reset voltage VR is applied to the drain region 204D of the reset transistor 204. The source region 204S is connected to the gate electrode of a source follower transistor.

A depletion layer extends under the n-type layer 202. As light enters from the upper surface of the silicon substrate 200 into the depletion layer via the n-type layer 202, pairs of electrons and holes are generated in the depletion region and electrons are accumulated in the n-type layer 202. In this manner, photoelectric conversion is achieved by light transmitted through the n-type layer 202. Since light of a shorter wavelength is likely to be absorbed in the n-type layer 202, the sensitivity for light of a shorter wavelength is lower than that for light of a longer wavelength.

As shown in FIG. 14B, as the n-type layer 202 is made thin, absorption of light of the shorter wavelength becomes small so that the sensitivity can be raised. However, as the n-type layer 202 is made thin, the depletion layer to be formed under the n-type layer 202 is likely to contact the shallow bottom area of the field oxide film 201 at the boundary P between the active region and nearby field oxide film 201. When the silicon substrate is subjected to local oxidation, stresses are concentrated upon this shallow bottom area of the field oxide film 201. Since the depletion layer contacts this shallow bottom area, leak current becomes large.

FIG. 15A is a cross sectional view of a photodiode and a reset transistor of a conventional CMOS type solid-state imaging device using a $p^+np$-type photodiode, and FIG. 15B is a plan view thereof. A cross sectional view taken along one-dot chain line A15—A15 corresponds to FIG. 15A. Different points from the solid-state imaging device shown in FIG. 15A will be described.

A $p^+$-type layer 210 is formed in a partial surface layer of an active region surrounded by a field oxide film 201, and an n-type layer 211 is formed under the $p^+$-type layer. The n-type layer 211 is in contact with the source region 204S of a reset transistor 204. A depletion layer is formed at the interface between the n-type layer 211 and $p^+$-type layer 210 and under the n-type layer 211. Since the n-type layer 211 is not exposed on the surface of the silicon substrate 200 but buried in the inside of the silicon substrate, the depletion layer does not contact the field oxide film 201. Leak current can therefore be made small.

In the CMOS type solid-state imaging device shown in FIGS. 15A and 15B, the depletion layer formed at the interface between the n-type layer 211 and $p^+$-type layer 210 is thinner than the depletion layer formed under the n-type layer 211. Most of the junction capacitance is therefore the capacitance between the n-type layer 211 and $p^+$-type layer 210. Since the junction capacitance becomes large, the photo detector sensitivity lowers. Since the depletion layer above the n-type layer 211 is large, photoelectric conversion is mainly achieved in the depletion layer formed under the depletion layer 211. Since light of a shorter wavelength attenuates when it transmits through the $p^+$-type layer 210 and n-type layer 211, the sensitivity of the shorter wavelength among others lowers.

As shown in FIG. 15B, the outer periphery of the n-type layer 211 is spaced apart from the boundary between the field oxide film 201 and active region by a predetermined width toward the active region side, e.g., by 0.1 to 0.2 $\mu$m.

It is therefore possible to prevent the depletion region to be formed at the interface between the n-type layer 211 and p+-type layer 210 from contacting the field oxide film 201. With this structure, however, the effective light reception area of the photodiode becomes small. As each pixel is made finer, the frame area between the n-type layer 211 and field oxide film 201 becomes large.

SUMMARY OF THE INVENTION

An object of this invention is to provide a semiconductor photo detector to be applied to a solid-state imaging device of high sensitivity and low leak current.

According to one aspect of the present invention, there is provided a semiconductor photo detector comprising: a device isolation insulating region formed in a surface layer of a semiconductor substrate, the device isolation insulating region defining an active region; a first layer of a first conductivity type formed in a partial surface layer of the active region; a buried layer of a second conductivity type opposite to the first conductivity type for defining a depletion layer between the first layer and the buried layer, as viewed along a line parallel to a normal of a surface of the semiconductor substrate the buried layer being disposed so as to be partially superposed upon the first layer, and being disposed deeper than the first layer, with an upper surface of the buried layer being set to a position deeper than a bottom of the device isolation insulating region; a MISFET formed in a region of the active region where the first layer is not formed, the MISFET comprising first and second impurity diffusion regions of the second conductivity type disposed in the surface layer of the semiconductor substrate and sandwiching a channel region and a gate electrode formed on a gate insulating film on the channel region, bottoms of the first and second impurity diffusion regions being disposed at a position shallower than the upper surface of the buried layer; and a buried layer connection region of the second conductivity type for electrically connecting the first impurity diffusion region and the buried layer.

When light becomes incident upon the depletion layer between the first layer and the buried layer, pairs of electrons and holes are generated, and carriers are accumulated in the buried layer so that the potential of the buried layer changes. A change amount of the potential to be caused by carriers is dependent upon a light reception amount. Although the buried layer is formed in a deep region, since the buried layer connection region is disposed, it is possible to electrically connect the buried layer and the first impurity diffusion region of MISFET. Since the buried layer is formed in the deep region, an electrostatic capacitance between the first layer and buried layer becomes small so that the light reception sensitivity can be raised.

According to another aspect of the invention, there is provided a semiconductor photo detector comprising: a device isolation insulating region formed in a surface layer of a semiconductor substrate, the device isolation insulating region defining an active region; a first layer of a first conductivity type formed in a partial surface layer of the active region, the first layer defining a depletion layer under the first layer; a first region of the first conductivity type disposed between the first layer and the device isolation insulating region, the first region including a region superposed upon the first layer and the device isolation insulating region as viewed toward a surface of the semiconductor substrate; and a MISFET formed in a region of the active region where the first layer is not formed, the MISFET comprising first and second impurity diffusion regions of a second conductivity type opposite to the first conductivity type disposed in the surface layer of the semiconductor substrate and sandwiching a channel region and a gate electrode formed on a gate insulating film on the channel region, the first impurity diffusion region being electrically connected to the first layer.

When light becomes incident upon the depletion layer under the first layer, pairs of electrons and holes are generated, and carriers are accumulated in the first layer so that the potential of the first layer changes. A change amount of the potential of the first layer is dependent upon a light reception amount. Since the first region is disposed between the first layer and device isolation insulating region, the depletion layer will not contact the shallow bottom area of the device isolation insulating region. It is therefore possible to prevent an increase in leak current.

According to another aspect of the invention, there is provided a semiconductor photo detector comprising: a photodiode including a first layer of a first conductivity type and formed in a surface layer of a semiconductor substrate, the first layer defining a depletion layer at an interface with the semiconductor substrate; a transfer transistor comprising a first drain region and a first source region of the first conductivity type disposed sandwiching a first channel region defined in the surface layer of the semiconductor substrate and a first gate electrode disposed on a first gate insulating film on the first channel region, the first source region being continuous with the first layer; a reset transistor comprising a second drain region and a second source region of the first conductivity type disposed sandwiching a second channel region defined in the surface layer of the semiconductor substrate and a second gate electrode disposed on a second gate insulating film on the second channel region, the second source region being continuous with the first drain region; a reset voltage line for applying a reset voltage to the second drain region of the reset transistor; a source follower transistor comprising a third drain region and a third source region of the first conductivity type disposed sandwiching a third channel region defined in the surface layer of the semiconductor substrate and a third gate electrode disposed on a third gate insulating film on the third channel region, the third drain region being connected to the reset voltage line and the third gate electrode being connected to the first drain region of the transfer transistor; a select transistor comprising a fourth drain region and a fourth source region of the first conductivity type disposed sandwiching a fourth channel region defined in the surface layer of the semiconductor substrate and a fourth gate electrode disposed on a fourth gate insulating film on the fourth channel region, the fourth drain region being continuous with the third source region and the fourth gate electrode being continuous with the first gate electrode of the transfer transistor; a signal line formed on or over the semiconductor substrate and connected to the fourth source region of the select transistor; a select line formed on or over the semiconductor substrate and connected to the first and fourth gate electrodes; and a reset signal line formed on or over the semiconductor substrate and connected to the second gate electrode.

The photodiode is initialized by making the reset transistor and transfer transistor on-states. By making the transfer transistor off-state, carriers corresponding to a light reception amount are accumulated in the first layer of the photodiode and the potential of the first layer changes. As the reset transistor is made off-state and the transfer transistor is made on-state, the voltage at the first layer of the photodiode is applied to the third gate electrode of the source follower transistor. As the select transistor is made on-state, a signal voltage dependent upon the voltage at the first layer is applied to the signal line. As the reset transistor is made on-state, the reset voltage is applied to the gate electrode of the source follower transistor and a voltage dependent upon the reset voltage is applied to the signal line. Since the first gate electrode of the transfer transistor and the fourth gate electrode of the select transistor are interconnected by a single select line, the wiring space can be made small more than the case wherein one control line is provided for each of two transistors. The light reception area can therefore be made large.

As above, a solid-state imaging device of high sensitivity and low leak current can be provided.

BRIEF DESCRIPTION OF THE DRAWINGS

FIGS. 4A to 4D are cross sectional views of a substrate illustrating a method of manufacturing the CMOS type solid-state imaging device of the first embodiment.

DESCRIPTION OF THE PREFERRED EMBODIMENTS

Figure 1:
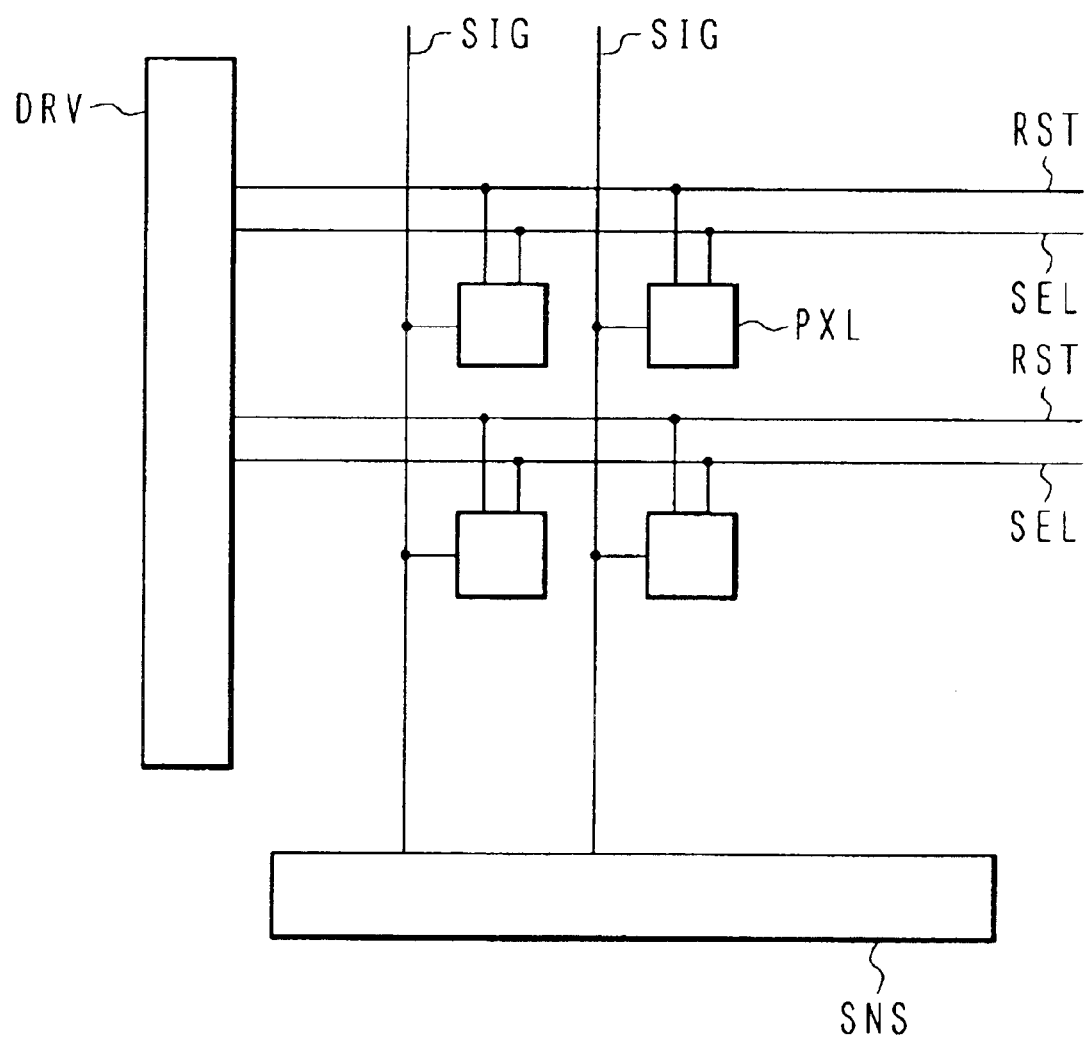
FIG. 1 is an equivalent circuit diagram of a CMOS type solid-state imaging device according to an embodiment of the invention.

FIG. 1 is a brief equivalent circuit diagram of a CMOS type solid-state imaging device. A plurality of pixels PXL are disposed in a matrix shape. A select line SEL and a reset line RST are disposed along each pixel PXL line, and a signal line SIG is disposed along each pixel PXL column. The select line SEL and reset line RST are connected to a drive circuit DRV, and the signal line SIG is connected to a read circuit SNS.

Figure 2A:
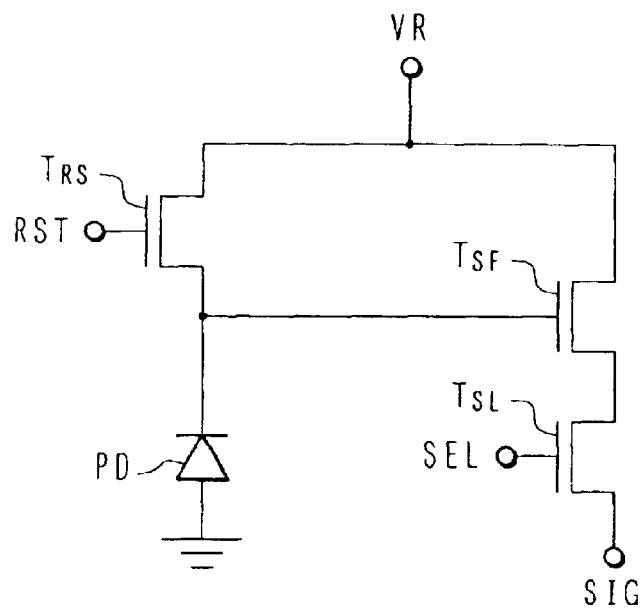
FIG. 2A is an equivalent circuit diagram of a pixel of a CMOS type solid-state imaging device according to a first embodiment of the invention.

FIG. 2A is an equivalent circuit diagram of one pixel of a three-transistor type solid-state imaging device. The cathode of a photodiode PD is connected via a reset transistor $T_{RS}$ to a reset voltage line VR. A reset voltage is applied to the reset voltage line VR. The anode of the photodiode PD is grounded.

A source follower transistor $T_{SF}$ and a select transistor $T_{SL}$ are serially connected. The drain terminal of the source follower transistor $T_{SF}$ is connected to the reset voltage line VR, and the source terminal of the select transistor $T_{SL}$ is connected to a signal line SIG. The gate electrode of the source follower transistor $T_{SF}$ is connected to the cathode of the photodiode PD, and the gate electrode of the select transistor $T_{SL}$ is connected to the select line SEL. The reset transistor $T_{RS}$, source follower transistor $T_{SF}$ and select transistor $T_{SL}$ are all n-channel type MOSFETs.

Although the transistors in each pixel are all n-channel MOSFETs, the peripheral circuit is made of CMOS transistors. From this reason, the solid-state imaging device shown in FIG. 2A is called a CMOS type solid-state imaging device.

The operation of the three-transistor type solid-state imaging device shown in FIG. 2A will be described briefly. First, the reset transistor $T_{RS}$ is made conductive to apply a reverse bias to the photodiode PD and initialize the cathode to a reset voltage. The reset transistor $T_{RS}$ is then made non-conductive to start light reception. As light becomes incident upon the photodiode PD, electrons are accumulated in the cathode and the potential of the cathode lowers.

As the cathode potential lowers, the potential of the gate electrode of the source follower transistor $T_{SF}$ lowers correspondingly. When the select transistor $T_{SL}$ is made conductive, a signal voltage corresponding to the lowered voltage at the cathode of the photodiode PD is output to the signal line SIG. The signal voltage output to the signal line SIG is detected by the read circuit SNS shown in FIG. 1. Next, the reset transistor $T_{RS}$ is made conductive to apply the reset voltage to the gate electrode of the source follower transistor $T_{SF}$. A voltage at the signal line SIG in this state is detected by the read circuit SNS.

A difference between two voltages detected by the read circuit SNS is obtained. This difference voltage has a value corresponding to the light reception amount by the photodiode PD. By obtaining the difference between two voltages, it is possible to eliminate the influence of a variation in signal voltages to be caused by a variation in threshold voltages of source follower transistors $T_{SF}$ and select transistors $T_{SL}$ of respective pixels.

Figure 2B:
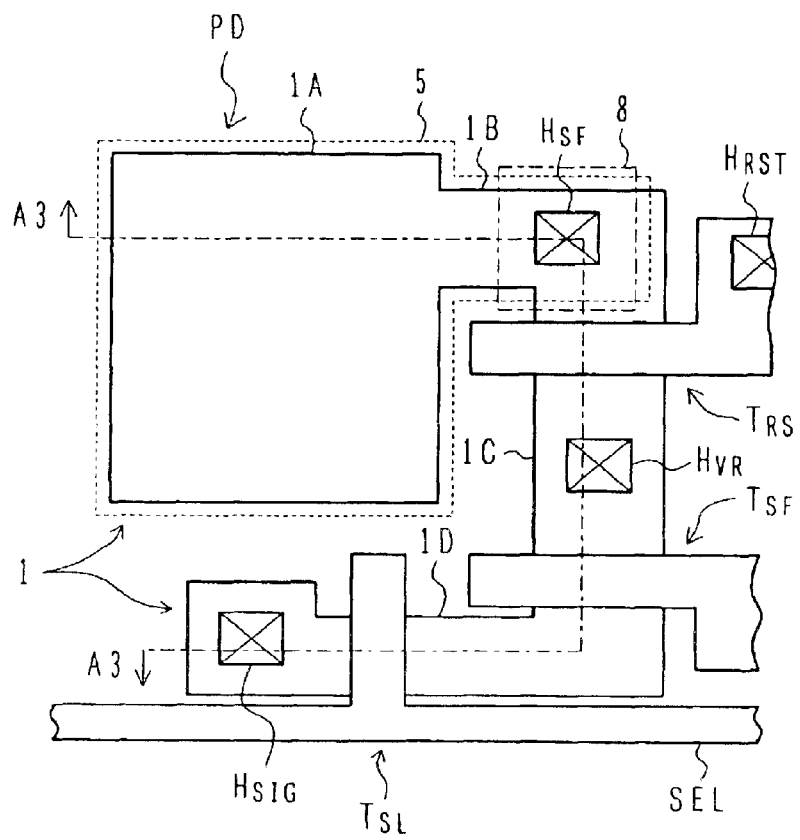
FIG. 2B is a plan view of one pixel.

FIG. 2B is a plan view of one pixel of the three-transistor type solid-state imaging device according to the first embodiment of the invention. An active region 1 comprises: a rectangular region 1A; a projected region 1B projecting from the rectangular region 1A near at the upper right side area thereof to the right; an extended region 1C being continuous with the front end of the projected region 1B, extending in the column direction and being spaced apart from the right side of the rectangular region 1A; and an extended region 1D being continuous with the bottom end of the region 1C extended in the column direction, extending in the row direction and being spaced apart from the lower side of the rectangular region 1A. The photodiode PD is disposed in the rectangular region 1A.

The gate electrode of the reset transistor $T_{RS}$ crosses the region 1C extended in the column direction of the active region 1. Under this cross area, the gate electrode of the source follower transistor $T_{SF}$ crosses the region 1C of the active region 1 extended in the column direction. The gate electrode of the select transistor $T_{SL}$ crosses the region 1D of the active region 1 extended in the row direction. The gate electrode of the select transistor $T_{SL}$ branches from the select line SEL extended in the row direction.

A contact hole $H_{SF}$ is disposed in a region (source region of the reset transistor $T_{RS}$) of the active region 1 between the rectangular region 1A disposed with the photodiode PD and the region disposed with the gate electrode of the reset transistor $T_{RS}$. The source region of the reset transistor $T_{RS}$ is connected to the gate electrode of the source follower transistor $T_{SF}$ via the contact hole $H_{SF}$ and an upper level wiring line.

An n-type buried layer 5 is disposed in a layer slightly deeper than the substrate surface and in a region of the active region 1 including the rectangular region 1A disposed with the photodiode PD and the region disposed with the contact hole $H_{SF}$. A buried layer connection region 8 is disposed in the region under the contact hole $H_{SF}$, the buried layer connection region 8 reaching the substrate surface extending from the upper surface of the n-type buried layer 5. The outer periphery of the n-type buried layer 5 extends inner than the edge of the active region 1 toward the field oxide film side. The contact hole $H_{SF}$ is positioned in an area smaller than the buried layer connection layer 8 as viewed in plan.

The gate electrode of the reset transistor $T_{RS}$ is connected to the upper level reset line RST (refer to FIG. 1 and FIG. 2A) via the contact hole $H_{RST}$.

A contact hole $H_{VR}$ is disposed in a region (drain region of the reset transistor $T_{RS}$ and drain region of the source follower transistor $T_{SF}$) of the active region 1 between the cross area of the gate electrode of the reset transistor $T_{RS}$ and the cross area of the gate electrode of the source follower transistor $T_{SF}$). The drain region of the reset transistor $T_{RS}$ and the drain region of the source follower transistor $T_{SF}$ are connected to the upper level reset voltage line VR (refer to FIG. 2A) via the contact hole $H_{VR}$.

A contact hole $H_{SIG}$ is disposed in a region (source region of the select transistor $T_{SL}$) of the active region 1 at the left of the cross area of the gate electrode of the select transistor $T_{SL}$. The source region of the select transistor $T_{SL}$ is connected to the upper level signal line SIG (refer to FIG. 1 and FIG. 2A) via the contact hole $H_{SIG}$.

Figure 3:
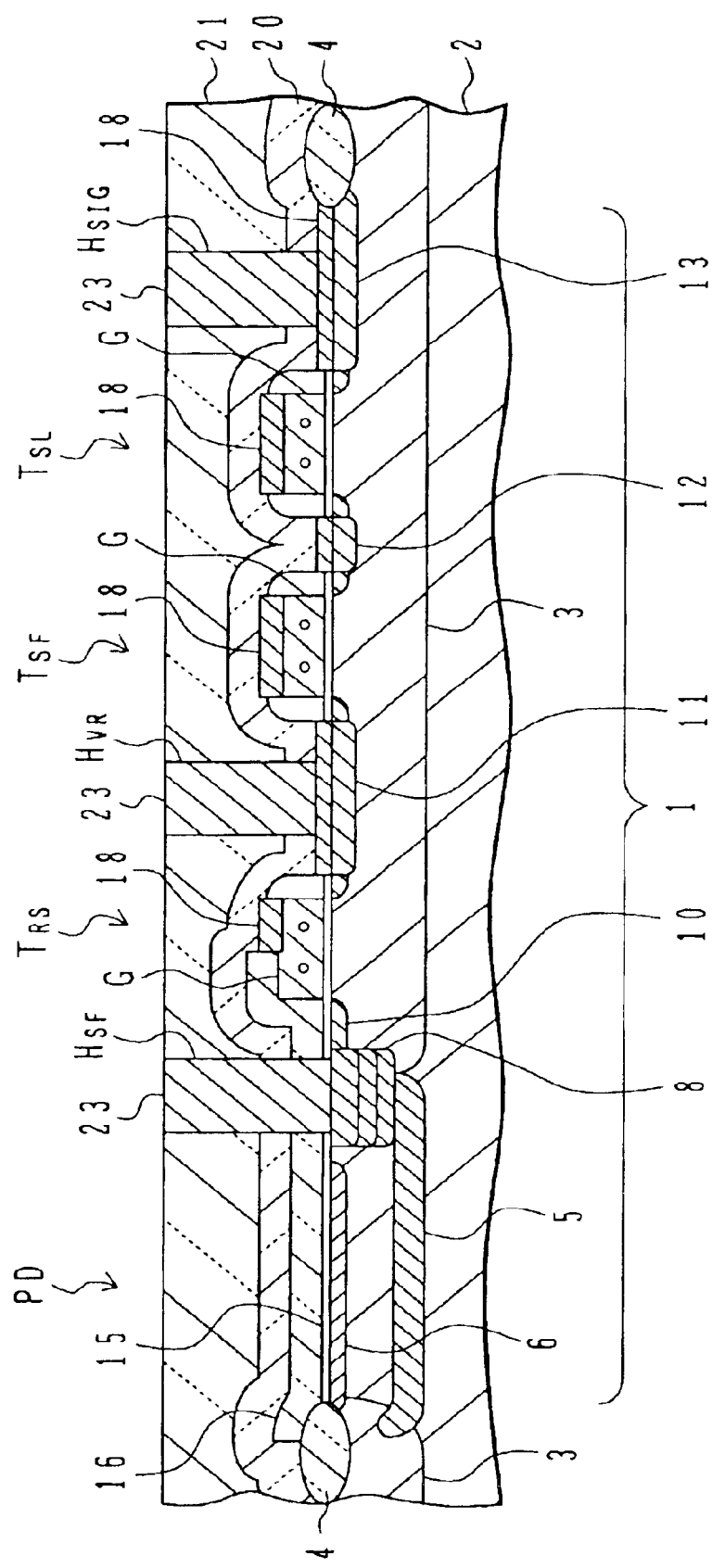
FIG. 3 is a cross sectional view of a main region of one pixel of the CMOS type solid-state imaging device of the first embodiment.

FIG. 3 is a cross sectional view taken along one-dot chain line A3-A3 shown in FIG. 2B. A field oxide film 4 having a thickness of 250 to 350 nm is formed on the surface of a p-type silicon substrate 2. The active region 1 is defined being surrounded by the field oxide film 4. A p-type well 3 is formed in the surface layer of the p-type silicon substrate 2, in the active region 1 other than the region where the photodiode PD is disposed and in the region where the field oxide film 4 is formed.

A p$^+$-type layer 6 is formed in the surface layer of the region where the photodiode PD is disposed, and the n-type buried layer 5 is formed in the deeper surface layer of the region where the photodiode PD is disposed, the n-type buried layer 5 being spaced apart from the p$^+$-type layer 6. The p$^+$-type layer 6 is in contact with the p-type well 3 formed under the field oxide film 4.

The n-type buried layer 5 is disposed at a position deeper than 0.5 μm from the surface of the silicon substrate 2, and the upper surface of the n-type buried layer 5 is set at the position deeper than the bottom of the field oxide film 4. As viewed along a line parallel to the substrate surface normal direction, almost the whole area of the n-type buried layer 5 is superposed upon the area of the p$^+$-type layer 6. Just under the field oxide film 4, the upper surface of the n-type buried layer 5 is at the position shallower by 0.1 to 0.2 μm than the upper surface of the n-type buried layer 5 just under the active region. Also in this region, there is a distance about 0.2 μm between the upper surface of the depletion layer extending from the n-type buried layer 5 and the bottom of the field oxide film 4. The depletion layer is formed between the n-type buried layer 5 and p$^+$-type layer 6 and under the n-type buried layer 5. The n-type buried layer 5 serves as the cathode of the photodiode PD and the p$^+$-type layer 6 and silicon substrate 2 serve as the anode of the photodiode PD.

As viewed along a line in parallel to the substrate surface normal direction, the edge portion of the n-type buried layer 5 superposes upon the field oxide film 4. Since the upper surface of the n-type buried layer 5 is disposed at the position deeper than the bottom of the field oxide film 4, even if the n-type buried layer 5 and field oxide film 4 are disposed being partially superposed, the depletion layer extending from the n-type buried layer 5 does not contact the field oxide film.

The n-type buried layer 5 is not disposed in the p-type well. Since the p-type impurity concentration of the silicon substrate under the n-type buried layer 5 is lower than that of the p-type well, the depletion layer extends longer under the n-type buried layer 5.

In and above the surface layer of the active region 1, the reset transistor $T_{RS}$, source follower transistor $T_{SF}$ and select transistor $T_{SL}$ are formed. These transistors are all n-channel MOSFETs. The n-type buried layer connection region 8 extends upward from the n-type buried layer 5 not superposed upon the p$^+$-type layer 6 and reaches the surface of the silicon substrate 2. The buried layer connection region 8 is in contact with the drain region 10 of the reset transistor $T_{RS}$.

An n-type first impurity diffusion region 11 formed in the surface layer of the silicon substrate 2 is used for both the drain region of the reset transistor $T_{RS}$ and the drain region of the source follower transistor $T_{SF}$. An n-type second impurity diffusion region 12 is used for both the source region of the source follower transistor $T_{SF}$ and the drain region of the select transistor $T_{SL}$. An n-type third impurity diffusion region 13 is used as the source region of the select transistor $T_{SL}$. The bottoms of the first to third impurity diffusion regions 11 to 13 are set to the position shallower than the upper surface of the n-type buried layer.

A gate oxide film 15 covers the surface of the silicon substrate 2 disposed with the photodiode PD. The gate oxide film 15 is disposed also between the gate electrode of MOSFET and silicon substrate 2. A mask film 16 made of silicon oxide continuously covers the surface of the silicon substrate 2 disposed with the photodiode PD, the surface of the source region 10 of the reset transistor $T_{RS}$ and a partial upper surface of the gate electrode G of the reset transistor $T_{RS}$.

A metal silicide film 18 made of, for example, titanium silicide, cobalt silicide or the like, is formed on the upper surface of the gate electrode G of the reset transistor $T_{RS}$ not covered with the mask film 16, on the upper surface of the gate electrode G of the source follower transistor $T_{SF}$, on the upper surface of the gate electrode of the select transistor $T_{SL}$, and on the upper surfaces of the first to third impurity diffusion regions 11, 12 and 13.

A lower level interlayer insulating film 20 made of silicon nitride or silicon oxynitride covers the mask film 16 and the transistors. A main interlayer insulating film 21 made of silicon oxide is formed on the lower level interlayer insulating film 20.

The contact hole $H_{SF}$ disposed in the area corresponding to the buried layer connection region 8 extends from the upper surface of the main interlayer insulating film 21 to the surface of the silicon substrate 2. As shown in FIG. 2B, as viewed along a line parallel to the substrate surface normal, the area of the contact hole $H_{SF}$ is smaller than the area of the buried layer connection region 8. The contact holes $H_{VR}$ and $H_{SIG}$ disposed in the area corresponding to the first and third impurity diffusion regions 11 and 13 extend from the upper surface of the main interlayer insulating film 21 to the upper surface of the metal silicide film 18.

The contact holes $H_{SF}$, $H_{VR}$ and $H_{SIG}$ are filled with plugs 23 of tungsten. The bottom and side walls of the contact holes $H_{SF}$, $H_{VR}$ and $H_{SIG}$ are covered with a barrier metal layer of TiN or the like.

Next, with reference to FIGS. 4A to 4D, description will be made on a method of manufacturing the CMOS solid-state imaging device of the first embodiment.

As shown in FIG. 4A, on the surface of a p-type silicon substrate 2, a field oxide film 4 is formed to a thickness of 250 to 350 nm (a general or main condition of 300 nm) by local oxidation of silicon (LOCOS). The field oxide film 4 defines active regions 1. A p-type well 3 is formed in which n-channel MOSFETs are to be formed. A gate oxide film 15 is formed to a thickness of 3 to 7 nm (a general condition of 5 nm) by thermally oxidizing the surface of the active region 1.

The processes up to the state shown in FIG. 4B will be described.

A polysilicon film is deposited on the substrate surface to a thickness of 150 to 250 nm (a general condition of 180 nm) by chemical vapor deposition (CVD). Phosphorous (P) ions are injected into regions of the polysilicon film where the gate electrodes of n-channel MOSFETs are to be formed, under the conditions of an acceleration energy of 10 to 30 keV (a general condition of 20 keV) and a dose of $2\times10^{15}$ to $6\times10^{15}$ cm$^{-2}$ (a general condition of $4\times10^{15}$ cm$^{-2}$. Thereafter, activation annealing is performed at about 800° C.

The polysilicon film is patterned to leave the gate electrodes G of MOSFETs. The polysilicon film can be etched by reactive ion etching (RIE) using chlorine-containing etching gas.

Figure 4C:
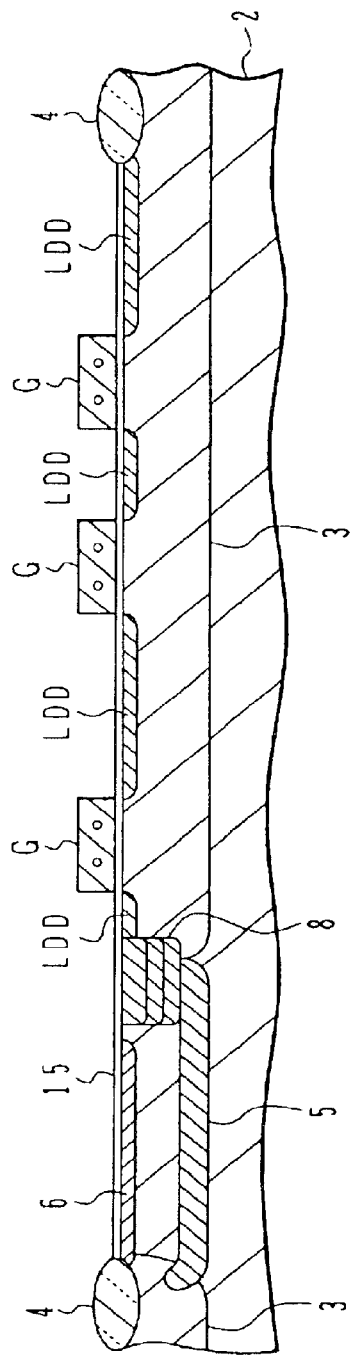

The processes up to the state shown in FIG. 4C will be descried. Phosphorous ions are implanted to form an n-type buried layer 5, under the conditions of an acceleration energy of 360 to 500 keV (a general condition of 420 keV), a dose of $0.5\times10^{12}$ to $1\times10^{13}$ cm$^{-2}$ (a general condition of $3\times10^{12}$ cm$^{-2}$) and an impurity profile peak depth of Rp=0.57 μm after ion implantation.

Next, phosphorous ions are implanted to form a buried layer connection region 8. The buried layer connection region 8 is formed by performing ion implantation three times under different implantation conditions. First, the shallowest region is formed by implanting phosphorus ions under the conditions of an acceleration energy of 30 to 100 keV (a general condition of 30 keV) and a dose of $1\times10^{14}$ to $5\times10^{15}$ cm$^{-2}$ (a general condition of $2\times10^{15}$ cm$^{-2}$). Next, a middle region is formed by implanting phosphorus ions under the conditions of an acceleration energy of 100 to 220 keV (a general condition of 160 keV), a dose of $1\times10^{12}$ to $3\times10^{13}$ cm$^{-2}$ (a general condition of $2\times10^{13}$ cm$^{-2}$) and Rp=0.21 μm. Lastly, a deepest region is formed by implanting phosphorus ions under the conditions of an acceleration energy of 200 to 360 keV (a general condition of 260 keV), a dose of $0.5\times10^{12}$ to $2\times10^{13}$ cm$^{-2}$ (a general condition of $1\times10^{13}$ cm$^{-2}$) and Rp=0.35 μm.

Low impurity concentration regions LDD of source and drain regions of n-channel MOSFETs having the lightly doped drain (LDD) structure are formed by ion implantation. In this case, phosphorous ions are implanted under the conditions of an acceleration energy of 10 to 30 keV (a general condition of 20 keV) and a dose of $2\times10^{13}$ to $1\times10^{14}$ cm$^{-2}$ (a general condition of $4\times10^{13}$ cm$^{-2}$).

Ion implantation is performed to form a p$^+$-type layer 6. In this case, boron ions are implanted under the conditions of an acceleration energy of 5 to 10 keV and a dose of $1\times10^{13}$ to $1\times10^{14}$ cm$^{-2}$. Instead, $BF_2$ ions may be implanted at an acceleration energy of 30 keV. This ion implantation also forms low impurity concentration regions of source and drain regions of p-channel MOSFETs in a peripheral circuit.

Since the ion implantation for forming the buried layer connection region 8 is performed independently from the ion implantation for forming the source and drain regions of the reset transistor $T_{RS}$, the impurity concentration of the buried layer connection region 8 can be controlled independently from the characteristics of the reset transistor $T_{RS}$.

Figure 4D:
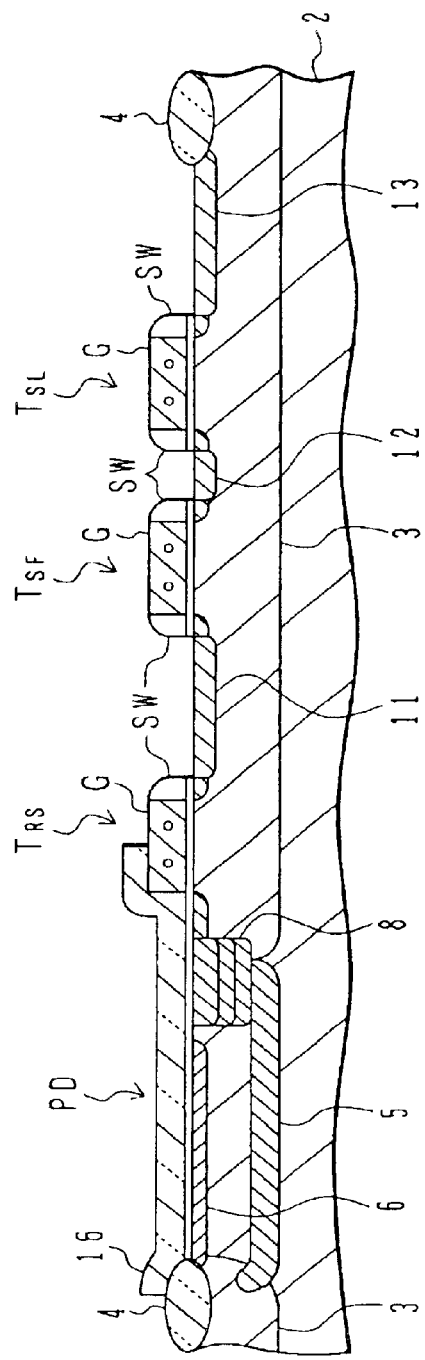

The processes up to the state shown in FIG. 4D will be described. A silicon oxide film is deposited on the substrate to a thickness of 50 to 150 nm (a general condition of 100 nm) by CVD. The silicon oxide film is covered with a resist pattern which continuously covers the surfaces starting from the surface of the region where the photodiode PD is formed to the partial upper surface of the gate electrode G of the reset transistor $T_{RS}$. By using the resist pattern as a mask, the silicon oxide film is anisotropically etched by RIE using fluorine-containing gas. After the etching, the resist pattern is removed. A mask film 16, which continuously covers the surfaces starting from the surface of the region where the photodiode PD is disposed to the partial upper surface of the gate electrode G of the reset transistor $T_{RS}$, is therefore left and a side wall spacer SW is therefore left on the side wall of the gate electrode G.

Phosphorous ions are implanted into the regions where n-channel MOSFETs are to be formed, under the conditions of an acceleration energy of 10 to 30 keV (a general condition of 20 keV) and a dose of $1\times10^{15}$ to $5\times10^{15}$ cm$^{-2}$ (a general condition of $2\times10^{15}$ cm$^{-2}$) to form first to third impurity diffusion regions 11 to 13. Boron ions are implanted into the regions where p-channel MOSFETs are to be formed, under the conditions of an acceleration energy of 5 to 10 keV (a general condition of 7 keV) and a dose of $1\times10^{15}$ to $5\times10^{15}$ cm$^{-2}$ (a general condition of $2\times10^{15}$ cm$^{-2}$).

The processes up to the state shown in FIG. 3 will be described. A Ti or Co film is deposited on the substrate by sputtering, and rapid thermal annealing (RTA) is performed to form metal silicide films 18 on the upper surface of the gate electrode G and on the upper surfaces of the first to third impurity diffusion regions 11 to 13. After RTA, unreacted Ti or Co films are removed. In this case, since the surface of the photodiode PD is covered with the mask film 16, the metal silicide film is not formed on the photodiode PD.

A lower level interlayer insulating film 20 of silicon nitride having a thickness of 50 to 100 nm is deposited by plasma CVD. As the lower level interlayer insulating film 20, a silicon oxynitride film having a thickness of 100 to 300 nm (a general condition of 200 nm) may be used. On the lower level interlayer insulating film 20, a main interlayer insulating film 21 is deposited by plasma CVD, the film being made of silicon oxide and having a thickness of 700 to 1500 nm (a general condition of 1000 nm). Chemical mechanical polishing (CMP) is performed to planarize the surface of the main interlayer insulating film 21.

After the surface of the main interlayer insulating film 21 is planarized, contact holes $H_{SF}$, $H_{VR}$ and $H_{SIG}$ are formed. A barrier metal layer and a tungsten layer are deposited and then CMP is performed to fill the contact holes $H_{SF}$, $H_{VR}$ and $H_{SIG}$ with conductive plugs 23.

The bottom of the source low impurity concentration region 10 of the reset transistor $T_{RS}$ shown in FIG. 3 is disposed at the position shallower than the upper surface of the n-type buried layer 5. By disposing the buried layer connection region 8 extending from the n-type buried layer 5 to the surface of the silicon substrate 2, the n-type buried layer 5 can be electrically connected to the source region 10 of the reset transistor $T_{RS}$.

In the first embodiment described above, since the n-type buried layer 5 is disposed at the deeper position, the junction capacitance of the photodiode PD can be made small. The sensitivity of the photodiode PD can therefore be improved.

Since the n-type buried layer 5 and the $p^+$-type layer 6 are disposed spaced apart by some distance in the depth direction, the depletion layer therebetween becomes thick. When light becomes incident upon the photodiode PD from the main interlayer insulating film 21 side, photoelectric conversion occurs mainly in the depletion layer at the position shallower than the n-type buried layer 5. It is therefore possible to suppress the sensitivity from being lowered by light absorption in the n-type buried layer 5.

The p-type well 3 having a higher p-type impurity concentration than that of the silicon substrate 2 is formed under the field oxide film 4 adjacent to the photodiode PD. It is therefore possible to prevent the depletion layer extending from the n-type buried layer 5 from contacting the field oxide film 4. Leak current can therefore be prevented from being increased.

Also, in the first embodiment described above, the region near the outer periphery of the n-type buried layer 5 extends under the field oxide film 4. Therefore, the effective light reception area can be increased more than a conventional photodiode in which the edge of the n-type layer of the photodiode is retracted from the edge of the field oxide film 4 toward the active region.

The contact hole $H_{SF}$ is formed just above the buried layer connection region 8 and the conductive plug 23 contacts the upper surface of the buried layer connection region 8. Since the conductive plug 23 contacts the relatively deep buried layer connection region 8, an increase in junction leak current can be prevented.

Next, with reference to FIGS. 5A and 5B, a modification of the first embodiment will be described. In the first embodiment, the buried layer connection region 8 shown in FIG. 3 is applied to the three-transistor type solid-state imaging device, whereas in the modification, the structure similar to the buried layer connection region 8 is applied to a four-transistor type solid-state imaging device.

Figure 5A:
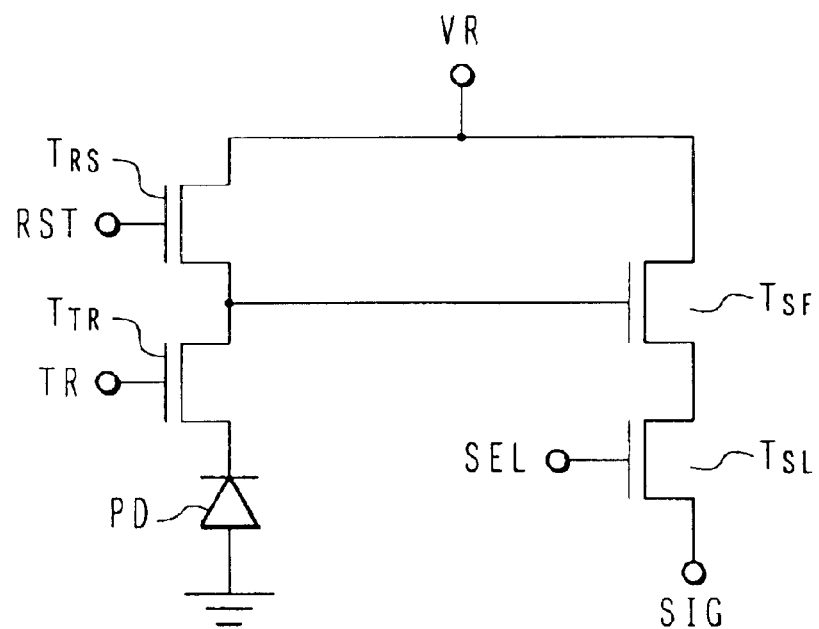
FIG. 5A is a cross sectional view of the CMOS type solid-state imaging device according to a modification of the first embodiment.

FIG. 5A is an equivalent circuit of one pixel of a general four-transistor type solid-state imaging device. In this modification, a transfer transistor $T_{TR}$ is inserted between the reset transistor $T_{RS}$ and photodiode PD of the three-transistor type solid-state imaging device shown in FIG. 2A. The voltage at the cathode of the photodiode PD is applied via the transfer transistor $T_{TR}$ to the gate electrode of the source follower transistor $T_{SF}$. The other structures are the same as those of the three-transistor type solid-state imaging device shown in FIG. 2A.

Figure 5B:
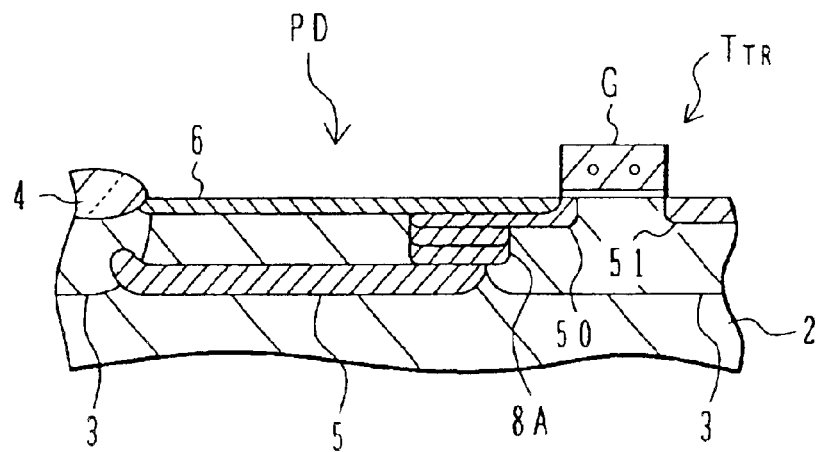
FIG. 5B is a partial cross sectional view thereof.

FIG. 5B is a cross sectional view of the photodiode PD and transfer transistor $T_{TR}$. The following description will be given by paying attention to different points from the cross sectional view of the three-transistor type solid-state imaging device shown in FIG. 3.

The transfer transistor $T_{TR}$ is formed in a p-type well 3. The transfer transistor $T_{TR}$ comprises: a source region 50 and a drain region 51 sandwiching the channel region; and a gate electrode G formed on a gate insulating film on the channel region. The source region 50 is connected via a buried layer connection region 8A to an n-type buried layer 5.

The buried layer connection region 8A is formed by implanting phosphorous ions twice. The first ion implantation is performed under the conditions of an acceleration energy of 100 to 220 keV and a dose of $1 \times 10^{12}$ to $3 \times 10^{13}$ cm$^{-2}$, and the second ion implantation is performed under the conditions of an acceleration energy of 200 to 360 keV and a dose of $5 \times 10^{11}$ to $2 \times 10^{13}$ cm$^{-2}$.

A $p^+$-type layer 6 overlaps the source region 50 partially and extends near to the gate electrode G of the transfer transistor $T_{TR}$. In this manner, a more completely buried type photodiode can be formed. Similar to the three-transistor type solid-state imaging device, it is possible to broaden the area of the n-type buried layer 5 and the light reception area.

Next, with reference to FIGS. 6 to 8, a CMOS type solid-state imaging device according to the second embodiment of the invention will be described.

Figure 6:
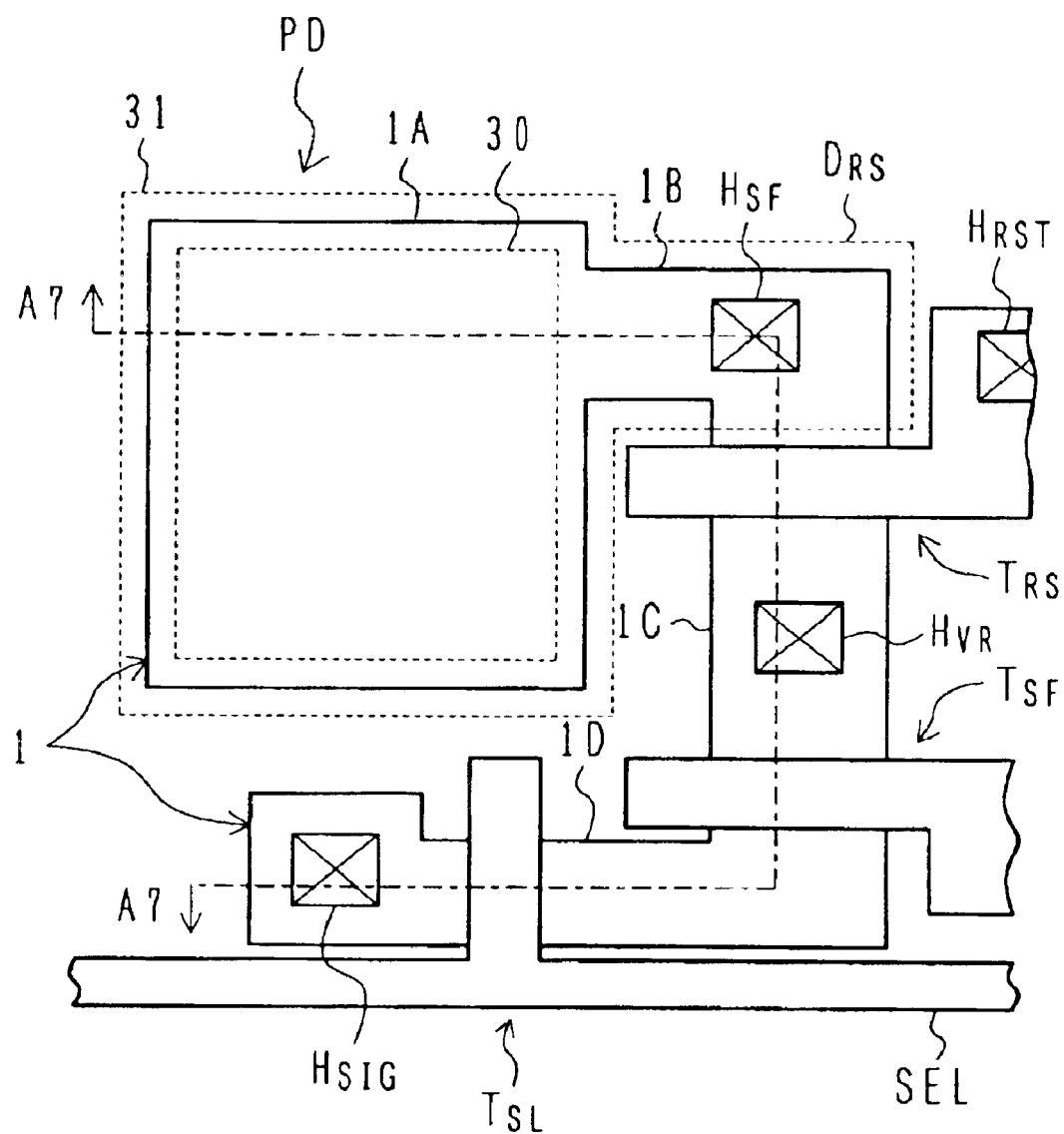
FIG. 6 is a plan view of one pixel of a CMOS type solid-state imaging device according to a second embodiment.

FIG. 6 shows a plan view of one pixel of a three-transistor type solid-state imaging device of the second embodiment. In the following, different points from the CMOS type solid-state imaging device of the first embodiment shown in FIG. 2B will be described.

An n-type layer 30 as the cathode of the photodiode PD is disposed inside of the rectangular region 1A of an active region 1. An n-type frame region 31 is disposed along the border line between the rectangular region 1A of the active region 1 and a field oxide film. The n-type frame region 31 extends along the side of the gate electrode of a reset transistor $T_{RS}$ to form a source high impurity concentration region $D_{RS}$ of the reset transistor $T_{RS}$. The other structures are the same as those of the CMOS type solid-state imaging device of the first embodiment shown in FIG. 2B.

Figure 7:
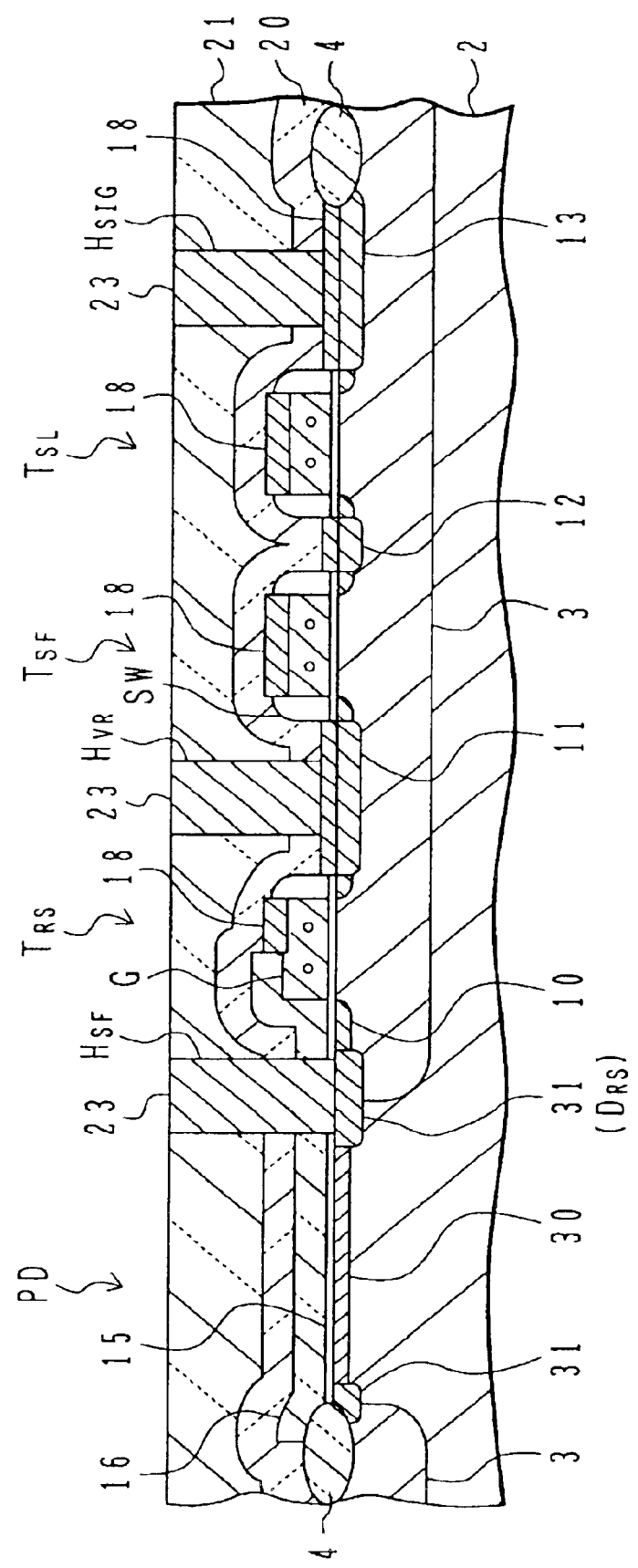
FIG. 7 is a cross sectional view of a main region of one pixel of the CMOS type solid-state imaging device of the second embodiment.
Figure 8:
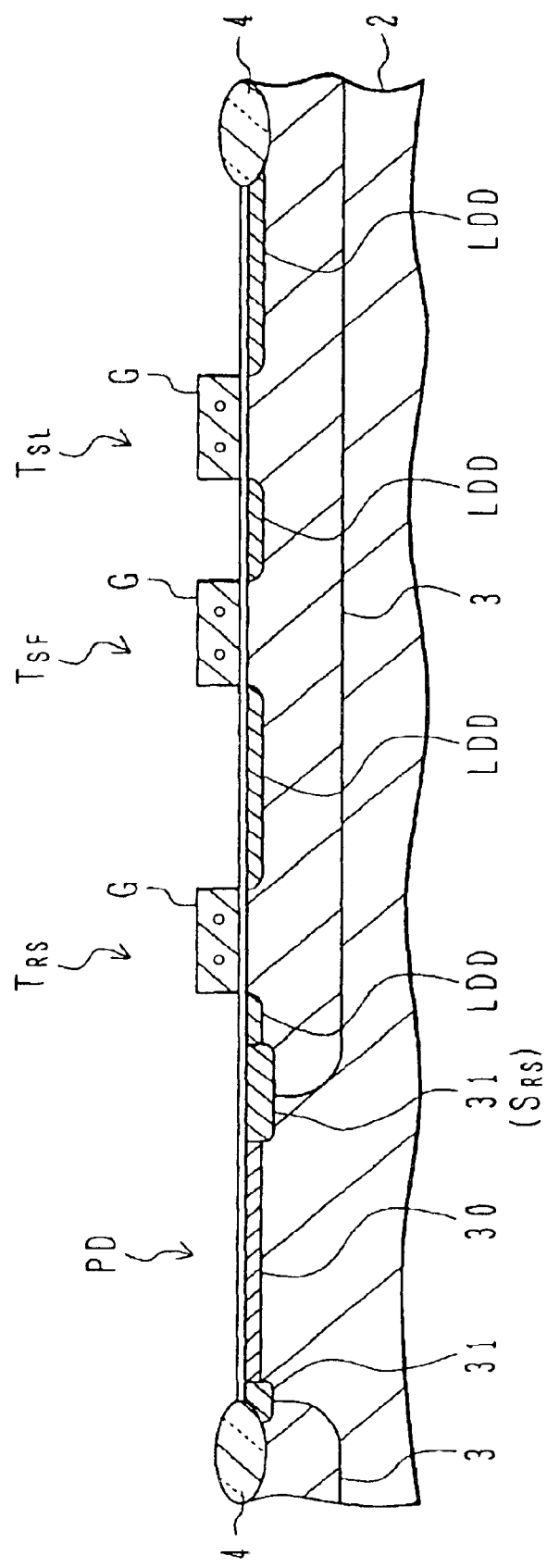
FIG. 8 is a cross sectional view of a substrate illustrating a method of manufacturing the CMOS type solid-state imaging device of the second embodiment.

FIG. 7 is a cross sectional view taken along one-dot chain line A7-A7 shown in FIG. 6. The structure from the gate electrode of the reset transistor $T_{RS}$ to the select transistor $T_{SL}$ is the same as that of the CMOS type solid-state imaging device of the first embodiment shown in FIG. 3.

The n-type layer 30 is formed in the surface layer of the silicon substrate 2 in the area where the photodiode PD is to be disposed. The n-type frame region 31 is formed along the border line between the field oxide film around the photodiode PD and the active region. The n-type frame region 31 extends to the position deeper than the n-type layer 30. As shown in FIG. 6, the n-type frame region 31 is continuous with the source high impurity concentration region $D_{RS}$ of the reset transistor $T_{RS}$ via the region not appeared in the cross sectional view of FIG. 7.

Next, with reference to FIG. 8, a method of manufacturing the CMOS type solid-state imaging device of the second embodiment will be described. By performing the processes similar to those of FIGS. 4A and 4B referred to for the description of the first embodiment, the p-type well 3, field oxide film 4 and gate electrode G are formed. Phosphorous ions are implanted into the region where n-channel MOSFETs are to be formed and into the region where the photodiode PD is to be formed, under the conditions of an acceleration energy of 10 to 30 keV (a general condition of 20 keV) and a dose of $1 \times 10^{13}$ to $1 \times 10^{14}$ cm$^{-2}$ (a general condition of $4 \times 10^{13}$ cm$^{-2}$). Low impurity concentration regions LDD of the source and drain regions of each n-channel MOSFET having the LDD structure and an n-type layer 30 of the photodiode PD are therefore formed. The depth of the n-type layer 30 is shallower than 0.1 μm. By forming the n-type layer 30 shallow in the central area of the photodiode, attenuation of short wavelength light in the n-type layer can be suppressed and the sensitivity can be improved.

Next, phosphorous ions are implanted to form the n-type frame region 31 and the source high impurity concentration region $D_{RS}$ of the reset transistor $T_{RS}$. An acceleration energy is 70 to 180 keV (a general condition of 100 keV) and a dose is $1 \times 10^{13}$ to $1 \times 10^{14}$ cm$^{-2}$ (a general condition of $2 \times 10^{13}$ cm$^{-2}$). The width of the n-type frame region 31 is 0.3 to 0.5 μm and the depth thereof is 0.1 to 0.25 μm.

The processes of forming a mask film 16, side wall spacers SW and conductive plugs 23 shown in FIG. 7 are the same as those of the first embodiment described with reference to FIG. 4D and FIG. 3. As viewed along a line parallel to the substrate surface normal, the area of a contact hole $H_{SF}$ formed on the source high impurity concentration region $D_{RS}$ is smaller than the area of the source high impurity concentration region $D_{RS}$. Since the conductive plug 23 contacts the relatively deep source high impurity concentration region $D_{RS}$, an increase in junction leak current can be suppressed.

The deep n-type frame region 31 exists in the region near the edge of the field oxide film 4 upon which stresses are concentrated. Therefore, the depletion layer extending downward from the n-type layer 30 does not contact the region upon which stresses are concentrated. It is therefore possible to prevent an increase in leak current in the region upon which stresses are concentrated.

In the second embodiment described above, the acceleration energy of ion implantation for forming the n-type frame region 31 is set higher than that for forming the n-type layer 30. Instead of setting the acceleration energy high, the dose may be increased. For example, the ion implantation may be performed under the conditions of an acceleration energy of 10 to 30 keV (a general condition of 20 keV) and a dose of $5 \times 10^{14}$ to $5 \times 10^{15}$ cm$^{-2}$ (a general condition of $2 \times 10^{15}$ cm$^{-2}$). As the dose is increased, impurities are diffused deeper during activation annealing. The n-type frame region 31 deeper than the n-type region 30 can therefore be formed.

The effects of preventing a leak current increase can be obtained sufficiently by setting the impurity concentration of the n-type layer 30 lower than $1 \times 10^{20}$ cm$^{-3}$ and that of the n-type frame region 31 higher than $1 \times 10^{20}$ cm$^{-3}$.

Figure 9:
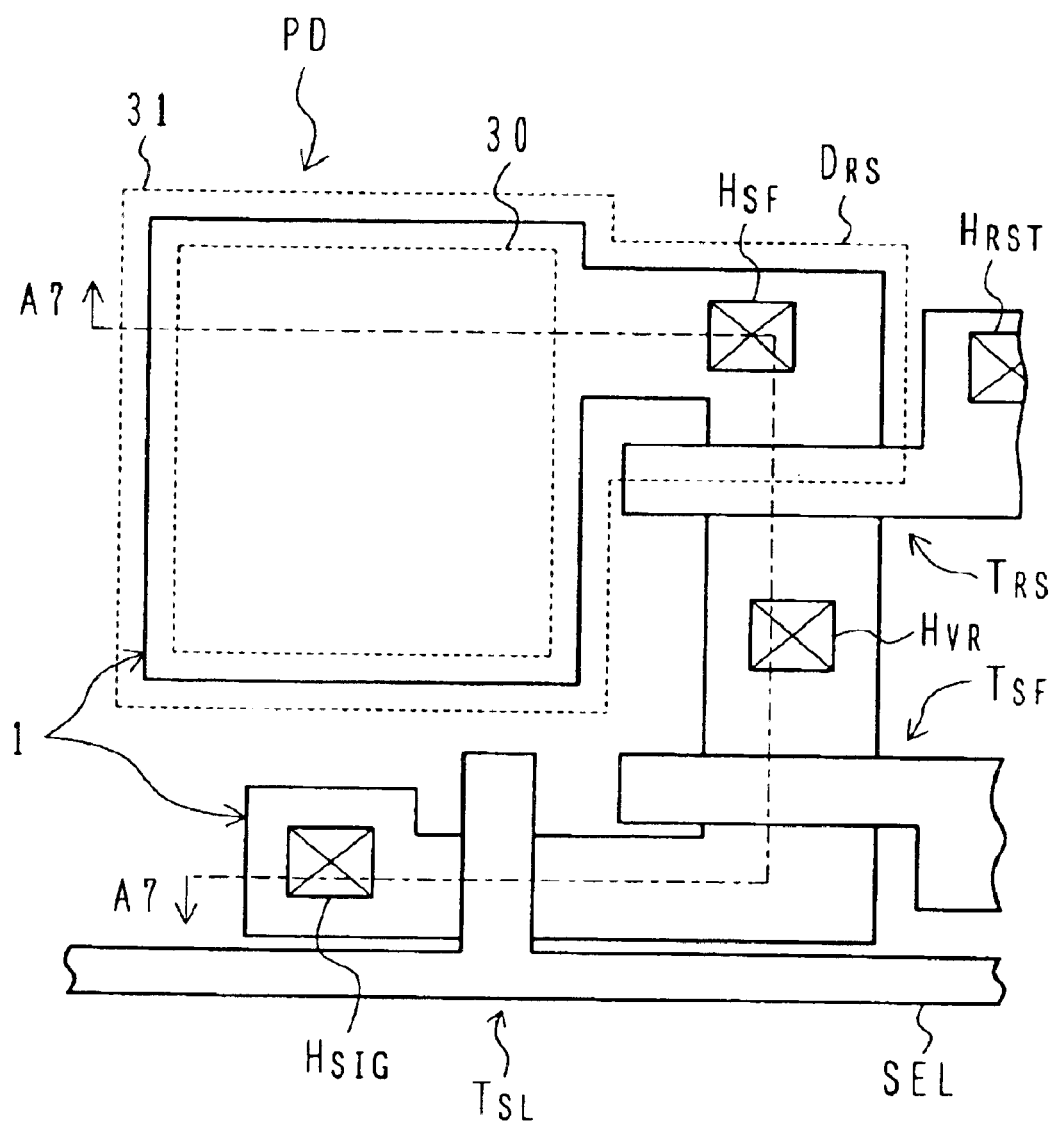
FIG. 9 is a plan view of one pixel of a CMOS type solid-state imaging device according to a modification of the second embodiment.

FIG. 9 is a plan view of a CMOS type solid-state imaging device according to a modification of the second embodiment. In the second embodiment shown in FIG. 6, the n-type frame region 31 extends to the side of the gate electrode of the reset transistor $T_{RS}$. In the modification of the second embodiment, as shown in FIG. 9 the n-type frame region 31 extends partially under the gate electrode of the reset transistor $T_{RS}$. Therefore, the deep n-type frame region 31 is disposed over the whole length of the edge of the field oxide film in contact with the active region 1 on the source region $D_{RS}$ side as viewed from the gate electrode of the reset transistor $T_{RS}$. It is therefore possible to further reduce leak current flowing via the region near the edge of the field oxide film upon which stresses are concentrated.

Ion implantation for forming the n-type frame region 31 is performed, for example, under the conditions of an acceleration energy of 10 to 30 keV (a general condition of 20 keV) and a dose of $5 \times 10^{14}$ to $5 \times 10^{15}$ cm$^{-2}$ (a general condition of $2 \times 10^{15}$ cm$^{-2}$). Ion implantation under the condition of a low acceleration energy does not adversely affect the characteristics of the reset transistor $T_{RS}$ even if the area of ion implantation partially covers the gate electrode of the reset transistor $T_{RS}$.

Next, with reference to FIGS. 10A, 10B and 11 to 13, a CMOS type solid-state imaging device according to the third embodiment will be described. The CMOS type solid-state imaging device of the first and second embodiments is of the three-transistor type, whereas the CMOS type solid-state imaging device of the third embodiment is of the four-transistor type.

Figure 10A:
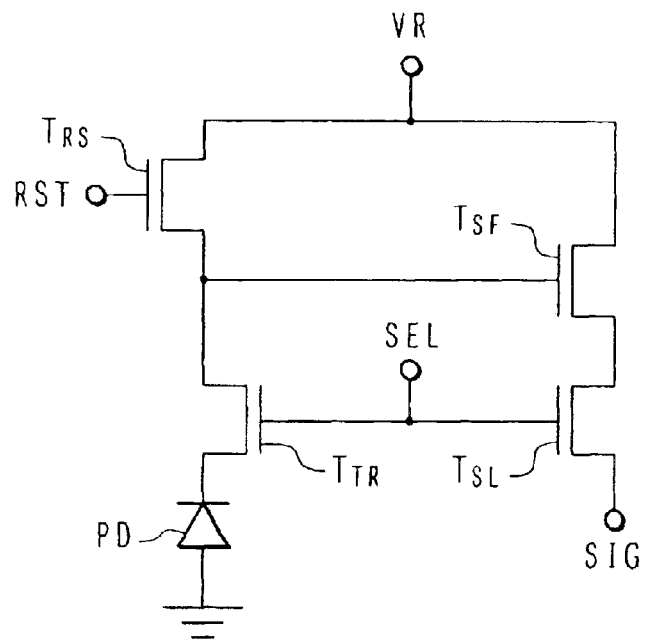
FIG. 10A is an equivalent circuit diagram of a pixel of a CMOS type solid-state imaging device according to a third embodiment of the invention.

FIG. 10A is an equivalent circuit diagram of one pixel of the CMOS type solid-state imaging device of the third embodiment. In the third embodiment, a transfer transistor $T_{TR}$ is inserted between the reset transistor $T_{RS}$ and photodiode PD of the three-transistor type solid-state imaging device shown in FIG. 2A. An interconnection point between the reset transistor $T_{RS}$ and the transfer transistor $T_{TR}$ is connected to the gate electrode of the source follower transistor $T_{SF}$. The gate electrode of the transfer transistor $T_{TR}$ is connected to the select line SEL along with the gate electrode of the select transistor $T_{SL}$.

Figure 10B:
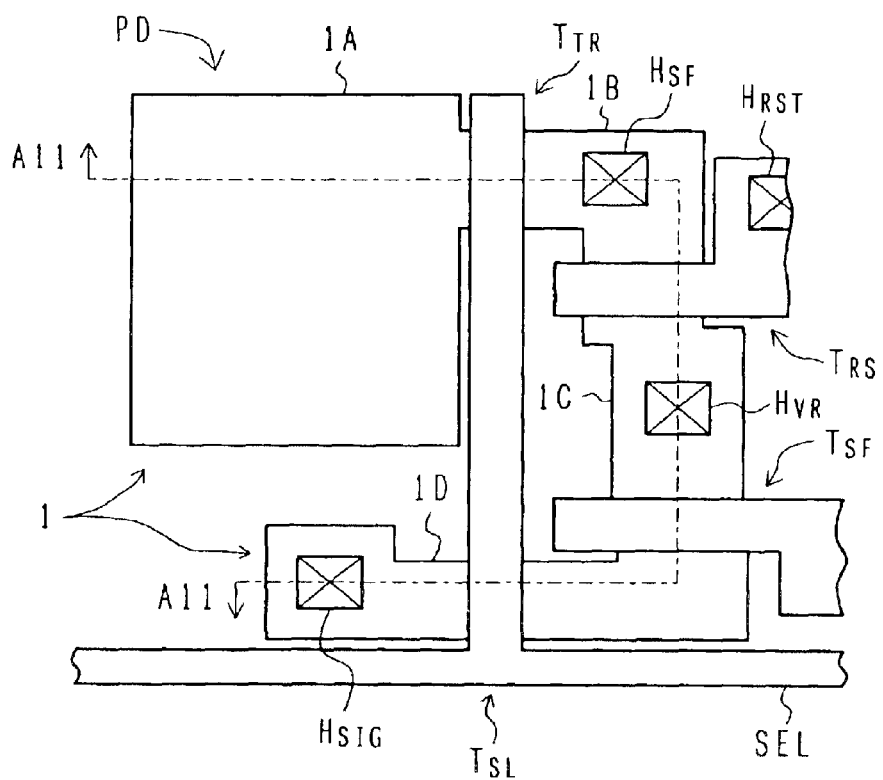
FIG. 10B is a plan view of one pixel.

FIG. 10B is a plan view of one pixel of the CMOS type solid-state imaging device of the third embodiment. Description will be given on different points from the plan view of one pixel of the CMOS type solid-state imaging device of the first embodiment shown in FIG. 2B.

In the first embodiment shown in FIG. 2B, the photodiode PD is disposed on a line extending from the gate electrode of the select transistor $T_{SL}$. In the third embodiment shown in FIG. 10B, the position of the photodiode PD is moved to the left as viewed in FIG. 10B. The gate electrode of the select transistor $T_{SL}$ extends upward in FIG. 10B and crosses the projected region 1B extended to the right in FIG. 10B from the rectangular region 1A where the photodiode PD is disposed. In this cross area, the transfer transistor $T_{TR}$ is disposed. The other structures are the same as those of the first embodiment shown in FIG. 2B.

Figure 11:
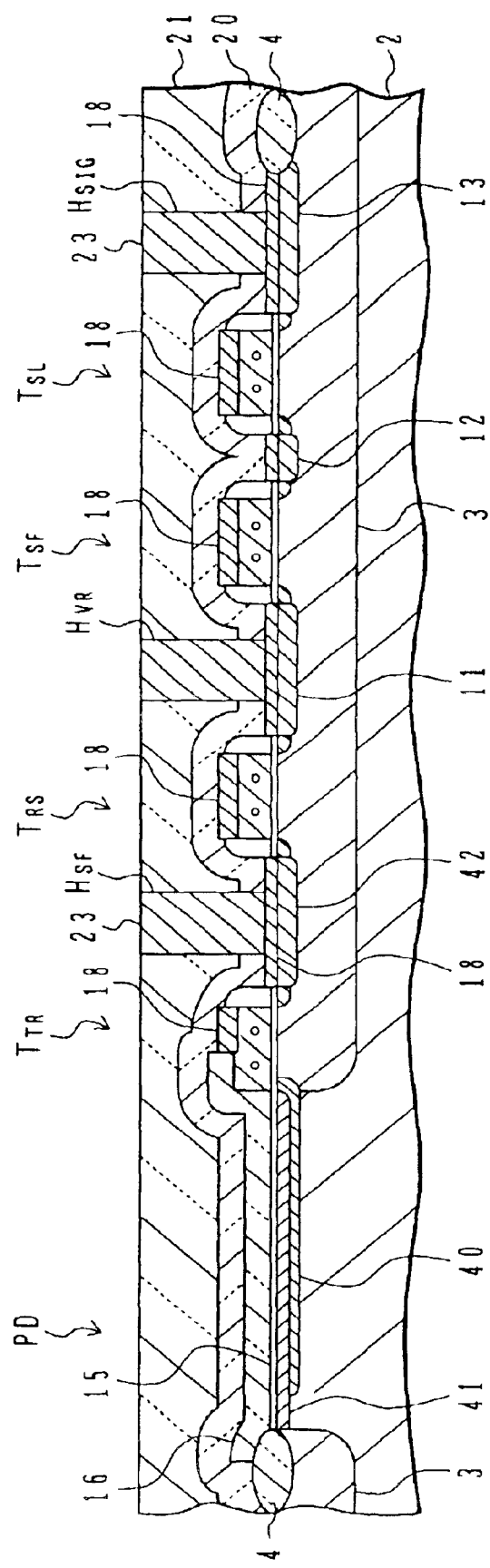
FIG. 11 is a cross sectional view of a main region of one pixel of the CMOS type solid-state imaging device of the third embodiment.

FIG. 11 is a cross sectional view taken along one-dot chain line A11—A11 shown in FIG. 10B. The photodiode PD is constituted of a p-type layer 41 formed in the surface layer of a silicon substrate 2 and an n-type buried layer 40 formed under the p-type layer. A transfer transistor $T_{TR}$, a reset transistor $T_{RS}$, a source follower transistor $T_{SF}$ and a select transistor $T_{SL}$ are formed in this order toward the right side of the photodiode PD in FIG. 11. The structures of the source follower transistor $T_{SF}$ and select transistor $T_{SL}$ are the same as those of the corresponding transistors shown in FIG. 3.

In the first embodiment, the source region 10 of the reset transistor $T_{RS}$ is connected to the n-type buried layer 5 via the buried layer connection region 8. In the third embodiment, a fourth impurity diffusion region 42 formed in the substrate surface between the gate electrode of the reset transistor $T_{RS}$ and the gate electrode of the transfer transistor $T_{TR}$ serves as both the source region of the reset transistor $T_{RS}$ and the drain region of the transfer transistor $T_{TR}$.

The n-type buried layer 40 extends to some depth under the gate electrode of the transfer transistor $T_{TR}$ and serves also as the source region of the transfer transistor $T_{TR}$. The p-type layer 41 contacts the p-type well 3 under the field oxide film 4 adjacent to the photodiode PD, and the edge of the n-type buried layer 40 is retracted from the border line between the field oxide film 4 and active region toward the active region side. Therefore, the depletion layer formed under the n-type buried layer 40 will not contact the region near at the edge portion of the field oxide film 4. It is therefore possible to prevent the generation of leak current at the interface between silicon oxide and silicon near at the edge portion of the field oxide film 4.

A mask film 16 of silicon oxide continuously covers the surfaces starting from the region where the photodiode PD is disposed to the partial upper surface of the gate electrode of the transfer transistor $T_{TR}$. The mask film 16 and each transistor are covered with a lower level interlayer insulating film 20 and a main interlayer insulating film 21.

A contact hole $H_{SF}$ is formed through the main interlayer insulating film 21 and lower level interlayer insulating film 20 in the area where the fourth impurity diffusion region 42 is disposed. A conductive plug 23 filled in the contact hole $H_{SF}$ is electrically connected via a metal silicide film 18 to the fourth impurity diffusion region 42. The structures of contact holes $H_{VR}$ and $H_{SIG}$ are the same as the corresponding contact holes $H_{VR}$ and $H_{SIG}$ of the first embodiment shown in FIG. 3.

Figure 12:
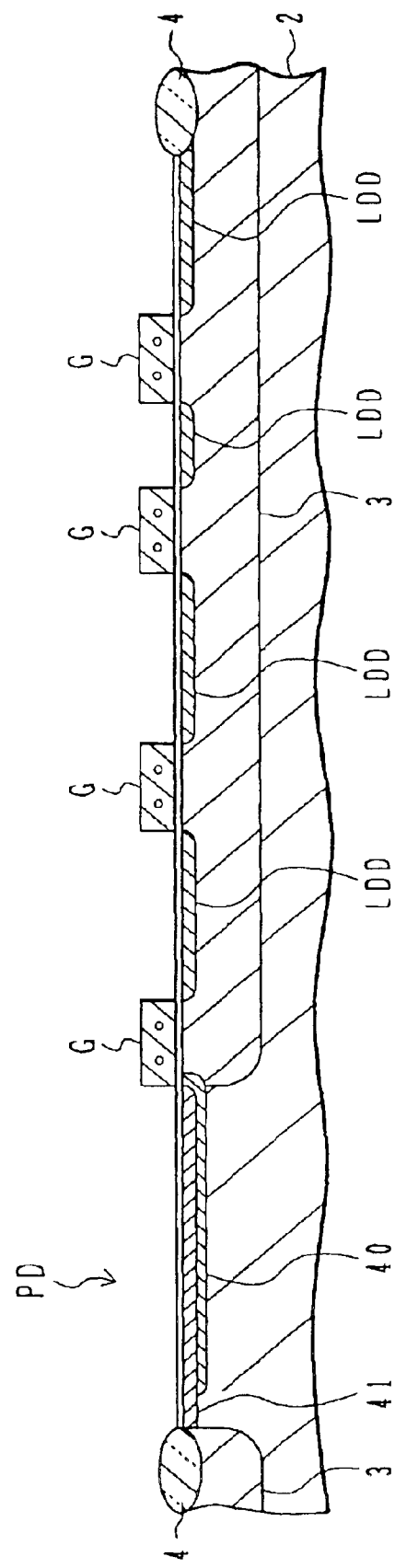
FIG. 12 is a cross sectional view of a substrate illustrating a method of manufacturing the CMOS type solid-state imaging device of the third embodiment.

With reference to FIG. 12, description will be given on a method of manufacturing the CMOS type solid-state imaging device of the third embodiment. The processes up to forming the gate electrode G are the same as those of the method of manufacturing the CMOS type solid-state imaging device of the first embodiment described with reference to FIGS. 4A and 4B. Low impurity concentration regions LDD are thereafter formed by the same method as that of forming the low impurity concentration regions LDD of the source and drain regions shown in FIG. 4C.

Next, phosphorous ions are implanted to form an n-type buried layer 40, under the conditions of an acceleration energy of 30 to 300 keV (a general condition of 40 keV) and a dose of $1\times10^{12}$ to $5\times10^{13}$ cm$^{-2}$ (a general condition of $1\times10^{13}$ cm$^{-2}$). In this case, the ion implantation is performed in such a manner that the end of the n-type buried layer 40 crawls under the gate electrode. Next, $BF_2$ ions are implanted under the conditions of an acceleration energy of 30 keV and a dose of $1\times10^{13}$ cm$^{-2}$ to form a p-type layer 41 in the region shallower than the n-type buried layer 40. At the same time when the p-type layer 41 is formed, the low impurity concentration regions of the source and drain of each p-channel MOSFET (not appeared in FIG. 12) of the peripheral circuit are formed.

The processes of forming the mask film 16, impurity diffusion regions 11, 12, 13 and 42, lower level interlayer insulating film 20, main interlayer insulating film 21 and conductive plugs 23 shown in FIG. 11 are similar to those of the first embodiment described with reference to FIGS. 4D and 3.

Figure 13:
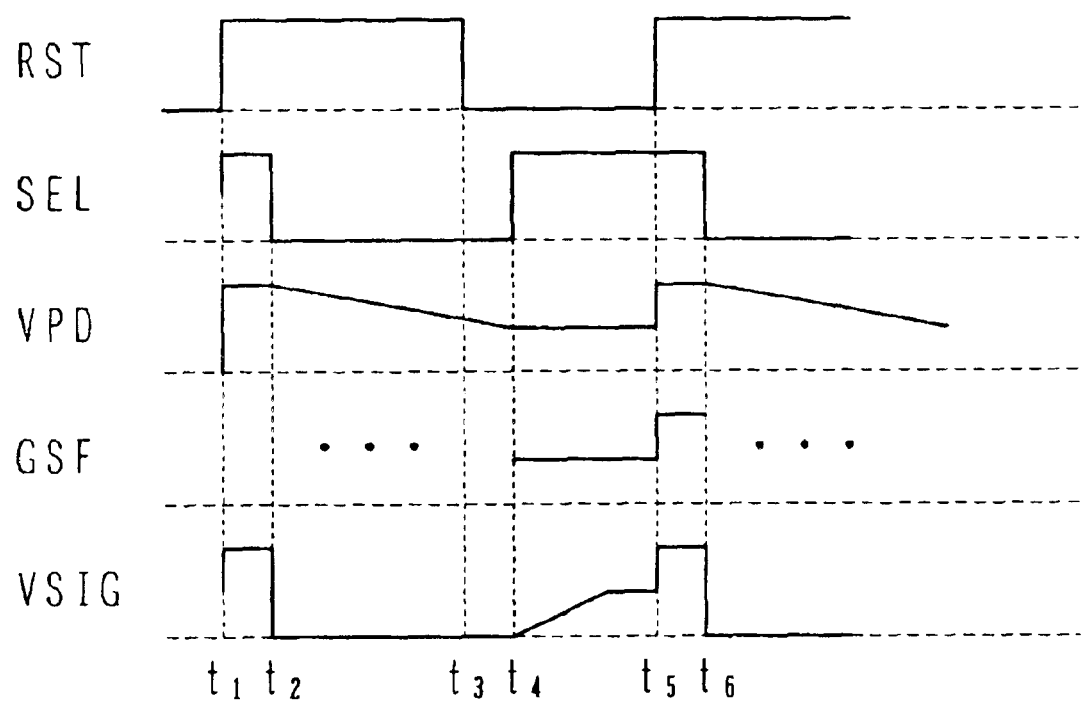
FIG. 13 is a timing chart illustrating the operation of the CMOS type solid-state imaging device of the third embodiment.
Figure 14A:
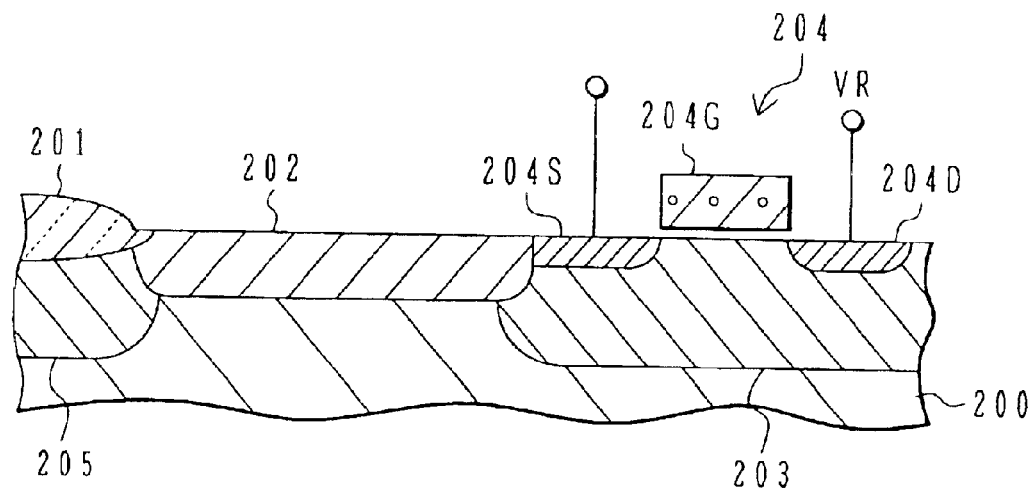
FIGS. 14A and 14B are cross sectional views of a main portion of a conventional solid-state imaging device using an n$^+$p-type photodiode.
Figure 14B:
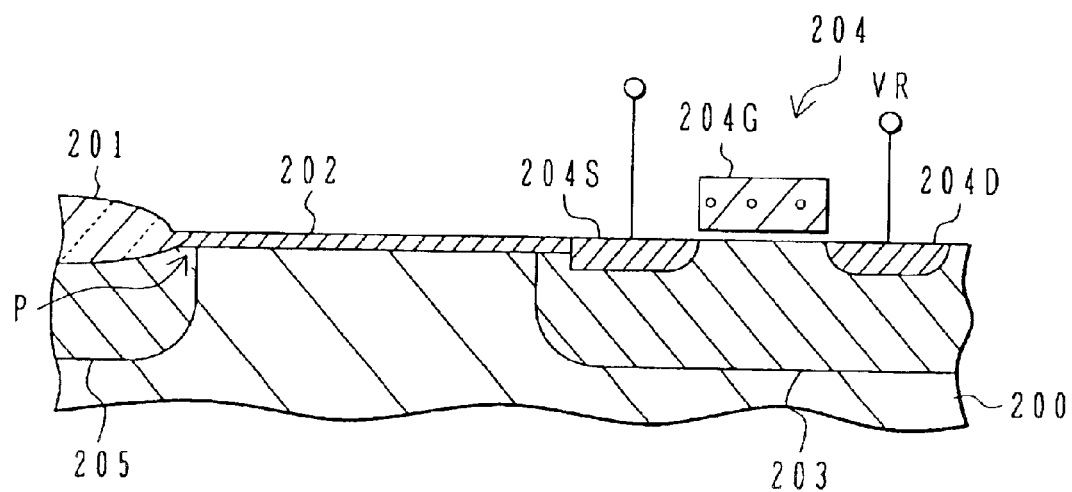
Figure 15A:
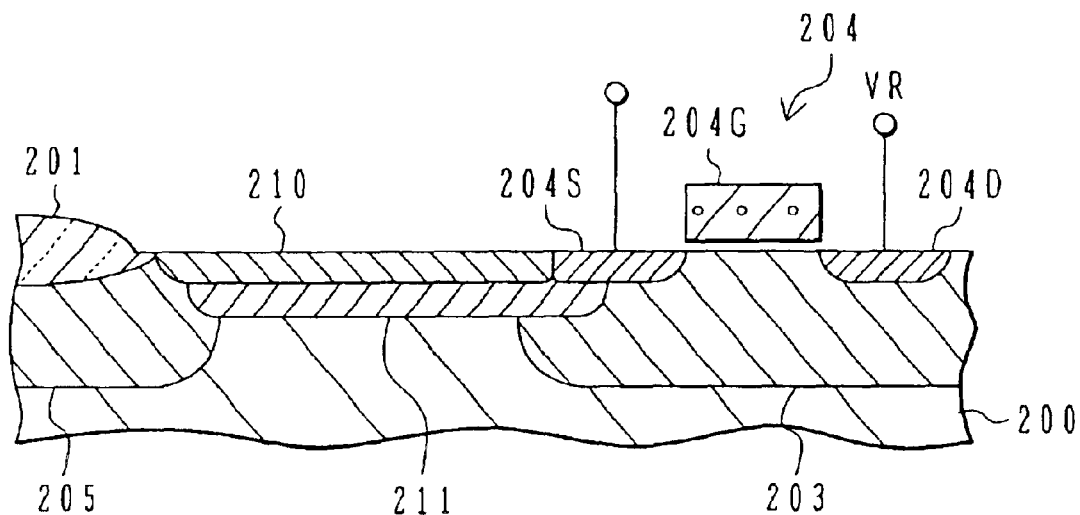
FIG. 15A is a cross sectional view of a main portion of a conventional solid-state imaging device using a p$^+$np-type photodiode.
Figure 15B:
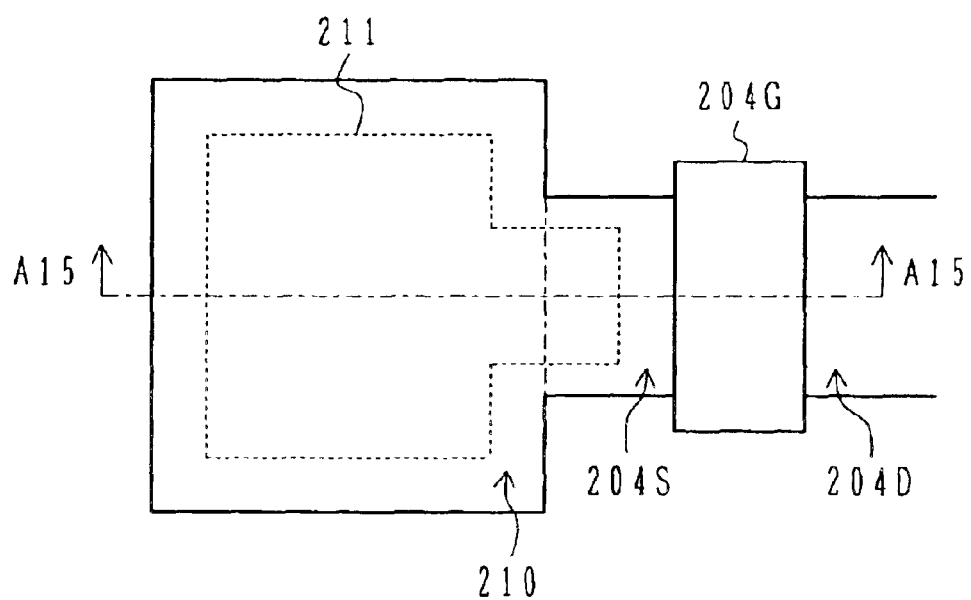
FIG. 15B is a plan view thereof.

FIG. 13 is an operation timing chart of the CMOS type solid-state imaging device of the third embodiment. In FIG. 13, RST represents a reset signal to be applied to the reset line RST, SEL represents a select signal to be applied to the select line, VPD represents the cathode voltage of the photodiode PD, GSF represents the gate voltage of the source follower transistor $T_{SF}$, and VSIG represents a signal voltage on the signal line SIG. In the following description, a voltage drop by a threshold value of each MOSFET is not taken into consideration unless otherwise specifically mentioned.

At time $t_1$ the select signal SEL is already in the high level state and the reset signal RST rises. The reset transistor $T_{RS}$ and transfer transistor $T_{TR}$ enter a conductive state so that the cathode voltage VPD of the photodiode PD is initialized to the reset voltage VR.

At time $t_2$ the select signal SEL falls so that the transfer transistor $T_{TR}$ enters the non-conductive state. Photoelectric conversion progresses in accordance with the intensity of light incident upon the photodiode PD to accumulate electrons in the cathode. The cathode voltage VPD of the photodiode PD therefore lowers.

At time $t_3$ the reset signal RST falls so that the reset transistor $T_{RS}$ enters the non-conductive state. At time $t_4$ immediately thereafter, the select signal SEL rises so that the transfer transistor $T_{TR}$ and select transistor $T_{SL}$ become conductive.

The cathode voltage VPD of the photodiode PD is therefore applied to the gate electrode of the source follower transistor $T_{SF}$ and to the source of the source follower transistor $T_{SF}$. This cathode voltage VPD is output via the select transistor $T_{SL}$ to the signal line SIG. The voltage VSIG on the signal line SIG gradually rises by being restricted by a CR time constant. When the signal voltage VSIG on the signal line SIG becomes constant, the read circuit SNS shown in FIG. 1 reads this voltage.

At time $t_5$ the reset signal RST rises. Therefore, the cathode voltage VPD of the photodiode PD is initialized to the reset voltage VR and the reset voltage VR is applied to the gate electrode of the source follower transistor $T_{SF}$. The source follower transistor $T_{SF}$ enters the conductive state and the reset voltage VR appears on the signal line SIG. This reset voltage VR is detected with the read circuit SNS shown in FIG. 1. A difference is obtained between the signal voltage VSIG detected immediately after time $T_5$ and the detected reset voltage VR.

At time $t_6$ the select signal SEL falls to enter the same state at time $t_1$.

The description given above does not consider the voltage drop by the threshold voltage of each MOSFET. In practice, however, the signal voltage VSIG and reset voltage VR output to the signal line SIG are made lower by the threshold voltage of the source follower transistor $T_{SF}$. The threshold voltage of MOSFET varies with each pixel. As described above, by obtaining a difference between the signal voltage VSIG corresponding to the received light amount and the detected reset voltage VR, the influence of a variation in threshold voltages can be eliminated and the generation of a fixed noise pattern can be prevented.

In the third embodiment, as shown in FIG. 12, the conductive plug of tungsten or the like does not contact the n-type buried layer 40 corresponding to the cathode of the photodiode PD. It is therefore possible to prevent an increase in junction leak current to be caused by the contact with the conductive plug.

Also in the third embodiment, as shown in FIG. 10B, the gate electrode of the select transistor $T_{SL}$ extends upward in FIG. 10B to constitute the gate electrode of the transfer transistor $T_{TR}$. In a conventional four-transistor type solid-state imaging device, it is necessary to provide a control line for controlling the gate electrode of the transfer transistor $T_{TR}$ and a contact hole for interconnecting the gate electrode and control line. In the third embodiment, these control line and contact hole are not necessary so that the ratio of the area occupied by the photodiode PD to the area of one pixel can be made large.

As described with reference to FIG. 13, it is preferable to set time $t_3$ when the reset signal RST rises, immediately before time $t_4$ when the select signal SEL rises. With this setting of timings, it becomes possible to shorten the period of the floating state of the interconnection point between the reset transistor $T_{RS}$ and transfer transistor $T_{TR}$ shown in FIG. 10A.

This interconnection point corresponds to the fourth impurity diffusion region 42 shown in FIG. 11. While the fourth impurity diffusion region 42 is in the floating state, the voltage at the impurity diffusion region 42 changes because of leak current. This voltage change influences the signal voltage to be applied to the gate electrode of the source follower transistor $T_{SF}$. The influence of junction leak current can be mitigated by shortening the period while the fourth impurity diffusion region 42 is in the floating state. For example, the influence of junction leak current can be mitigated by conducting a timing control in such a manner that the period from time $t_2$ to time $t_4$ is set to 300 times or more of the period from time $t_3$ to time $t_4$.

The present invention has been described in connection with the preferred embodiments. The invention is not limited only to the above embodiments. It is apparent that various modifications, improvements, combinations, and the like can be made by those skilled in the art.

I claim:

1. A semiconductor photo detector comprising:
    a device isolation insulating region formed in a surface layer of a semiconductor substrate, the device isolation insulating region defining an active region;
    a first layer of a first conductivity type formed in a partial surface layer of the active region;
    a buried layer of a second conductivity type opposite to the first conductivity type for defining a depletion layer between the first layer and the buried layer, as viewed along a line parallel to a normal of a surface of the semiconductor substrate the buried layer being disposed so as to be partially superposed upon the first layer, and being disposed deeper than the first layer, with an upper surface of the buried layer being set to a position deeper than a bottom of the device isolation insulating region;
    a MISFET formed in a region of the active region where the first layer is not formed, the MISFET comprising first and second impurity diffusion regions of the second conductivity type disposed in the surface layer of the semiconductor substrate and sandwiching a channel region and a gate electrode formed on a gate insulating film on the channel region, bottoms of the first and second impurity diffusion regions being disposed at a position shallower than the upper surface of the buried layer; and
    a buried layer connection region of the second conductivity type for electrically connecting the first impurity diffusion region and the buried layer.

2. A semiconductor photo detector according to claim 1, wherein as viewed along the line parallel to the normal of the surface of the semiconductor substrate, an edge of the buried layer is superposed upon the device isolation insulating region in contact with the active region.

3. A semiconductor photo detector according to claim 1, wherein:
    the buried layer connection region reaches the surface of the semiconductor substrate; and
    the semiconductor photo detector further comprises:
    an interlayer insulating film formed on the semiconductor substrate, covering the first layer and the MISFET;
    a contact hole formed through the interlayer insulating film, the contact hole being disposed inside the buried layer connection region as viewed along the line parallel to the normal of the surface of the semiconductor substrate; and
    a conductive member filled in the contact hole.

4. A semiconductor photo detector according to claim 2, wherein:
    the buried layer connection region reaches the surface of the semiconductor substrate; and
    the semiconductor photo detector further comprises:
    an interlayer insulating film formed on the semiconductor substrate, covering the first layer and the MISFET;
    a contact hole formed through the interlayer insulating film, the contact hole being disposed inside the buried layer connection region as viewed along the line parallel to the normal of the surface of the semiconductor substrate; and
    a conductive member filled in the contact hole.

5. A semiconductor photo detector comprising:
    a device isolation insulating region formed in a surface layer of a semiconductor substrate, the device isolation insulating region defining an active region;
    a first layer of a first conductivity type formed in a partial surface layer of the active region, the first layer defining a depletion layer under the first layer;
    a first region of the first conductivity type disposed between the first layer and the device isolation insulating region, the first region including a region superposed upon the first layer and the device isolation insulating region as viewed toward a surface of the semiconductor substrate; and
    a MISFET formed in a region of the active region where the first layer is not formed, the MISFET comprising first and second impurity diffusion regions of the first conductivity type disposed in the surface layer of the semiconductor substrate and sandwiching a channel region and a gate electrode formed on a gate insulating film on the channel region, the first impurity diffusion region being electrically connected to the first layer.

6. A semiconductor photo detector according to claim 5, wherein a depth from the surface of the semiconductor substrate to a bottom of the first layer is shallower than 0.1 $\mu$m and a depth from the surface of the semiconductor substrate to a bottom of the first region is deeper than 0.1 $\mu$m.

7. A semiconductor photo detector according to claim 6, wherein an impurity concentration of the first layer is lower than $1 \times 10^{20}$ cm$^{-3}$ and an impurity concentration of the first region is higher than $1 \times 10^{20}$ cm$^{-3}$.

8. A semiconductor photo detector according to claim 6 further comprising:
    an interlayer insulating film formed on the semiconductor substrate, covering the first layer and the MISFET;
    a second region formed in a partial surface layer of the active region, the second region being in contact with the first layer and having an impurity concentration same as an impurity concentration of the first region;
    a contact hole formed through the interlayer insulating film, the contact hole being disposed inside the second region as viewed along a line parallel to a normal of the surface of the semiconductor substrate; and a conductive member filled in the contact hole.

9. A semiconductor photo detector according to claim 5, wherein a depth from the surface of the semiconductor substrate to a bottom of the first layer is shallower than a depth from the surface of the semiconductor substrate to a bottom of the first region.

10. A semiconductor photo detector according to claim 5, wherein an impurity concentration of the first layer is lower than $1 \times 10^{20}$ cm$^{-3}$ and an impurity concentration of the first region is higher than $1 \times 10^{20}$ cm$^{-3}$.

11. A semiconductor photo detector according to claim 10 further comprising:

an interlayer insulating film formed on the semiconductor substrate, covering the first layer and the MISFET;

a second region formed in a partial surface layer of the active region, the second region being in contact with the first layer and having an impurity concentration same as an impurity concentration of the first region;

a contact hole formed through the interlayer insulating film, the contact hole being disposed inside the second region as viewed along a line parallel to a normal of the surface of the semiconductor substrate; and a conductive member filled in the contact hole.

12. A semiconductor photo detector according to claim 5 further comprising:

an interlayer insulating film formed on the semiconductor substrate, covering the first layer and the MISFET;

a second region formed in a partial surface layer of the active region, the second region being in contact with the first layer and having an impurity concentration same as an impurity concentration of the first region;

a contact hole formed through the interlayer insulating film, the contact hole being disposed inside the second region as viewed along a line parallel to a normal of the surface of the semiconductor substrate; and a conductive member filled in the contact hole.

13. A semiconductor photo detector comprising:

a photodiode including a first layer of a first conductivity type and formed in a surface layer of a semiconductor substrate, the first layer defining a depletion layer at an interface with the semiconductor substrate;

a transfer transistor comprising a first drain region and a first source region of the first conductivity type disposed sandwiching a first channel region defined in the surface layer of the semiconductor substrate and a first gate electrode disposed on a first gate insulating film on the first channel region, the first source region being continuous with the first layer;

a reset transistor comprising a second drain region and a second source region of the first conductivity type disposed sandwiching a second channel region defined in the surface layer of the semiconductor substrate and a second gate electrode disposed on a second gate insulating film on the second channel region, the second source region being continuous with the first drain region;

a reset voltage line for applying a reset voltage to the second drain region of the reset transistor;

a source follower transistor comprising a third drain region and a third source region of the first conductivity type disposed sandwiching a third channel region defined in the surface layer of the semiconductor substrate and a third gate electrode disposed on a third gate insulating film on the third channel region, the third drain region being connected to the reset voltage line and the third gate electrode being connected to the first drain region of the transfer transistor;

a select transistor comprising a fourth drain region and a fourth source region of the first conductivity type disposed sandwiching a fourth channel region defined in the surface layer of the semiconductor substrate and a fourth gate electrode disposed on a fourth gate insulating film on the fourth channel region, the fourth drain region being continuous with the third source region and the fourth gate electrode being continuous with the first gate electrode of the transfer transistor;

a signal line formed on or over the semiconductor substrate and connected to the fourth source region of the select transistor;

a select line formed on or over the semiconductor substrate and connected to the first and fourth gate electrodes; and a reset signal line formed on or over the semiconductor substrate and connected to the second gate electrode.

14. A semiconductor photo detector according to claim 13, further comprising:

a drive circuit for applying electric signals to the reset signal line and the select line to make steps be sequentially executed, the steps comprising:

(a) applying electric signals to the reset signal line and the select line to make the reset transistor and the transfer transistor on-states;

(b) applying an electric signal to the select line to make the select transistor off-state;

(c) making the off-state of the select transistor continue during a period;

(d) applying an electric signal to the reset signal line to make the reset transistor off-state;

(e) applying an electric signal to the select line to make the transfer transistor and the select transistor on-state, after the reset transistor is made off-state; and (f) applying an electric signal to the reset signal line to make the reset transistor on-state; and a read circuit for detecting an electric signal appearing on the signal line during a period of the step (e), detecting an electric signal appearing on the signal line during a period of the step (f), and comparing the electric signal detected at the step (e) with the electric signal detected at the step (f) to output a comparison result.

15. A semiconductor photo detector according to claim 14, wherein a time duration of the step (c) is 300 times or more of a time duration from the step (d) to the step (e).

* * * * *